(12) United States Patent
Zhou et al.

(10) Patent No.: US 9,980,415 B2
(45) Date of Patent: May 22, 2018

(54) CONFIGURABLE DOUBLE-SIDED MODULAR JET IMPINGEMENT ASSEMBLIES FOR ELECTRONICS COOLING

(71) Applicant: Toyota Motor Engineering & Manufacturing North America, Inc., Erlanger, KY (US)

(72) Inventors: Feng Zhou, South Lyon, MI (US); Ercan Mehmet Dede, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 126 days.

(21) Appl. No.: 14/831,208

(22) Filed: Aug. 20, 2015

(65) Prior Publication Data

US 2017/0055378 A1 Feb. 23, 2017

(51) Int. Cl.
*H05K 7/20* (2006.01)
(52) U.S. Cl.
CPC ............... *H05K 7/20927* (2013.01)
(58) Field of Classification Search
None
See application file for complete search history.

(56) References Cited

U.S. PATENT DOCUMENTS

| | | | |
|---|---|---|---|
| 1,929,824 A | 10/1933 | Polley | |
| 4,268,850 A | 5/1981 | Lazarek | |
| 4,631,573 A | 12/1986 | Sutrina | |
| 5,099,090 A | * 3/1992 | Allan | H01B 1/22 106/31.92 |
| 5,406,807 A | * 4/1995 | Ashiwake | H01L 23/427 165/908 |

(Continued)

FOREIGN PATENT DOCUMENTS

| | | |
|---|---|---|
| DE | 19646195 | 5/1998 |
| WO | 2004027232 | 4/2004 |

OTHER PUBLICATIONS

Sarangi, S., et al. (2014). "Manifold microchannel heat sink design using optimization under uncertainty." International Journal of Heat and Mass Transfer, 69: 92-105.

(Continued)

*Primary Examiner* — Xanthia C Cunningham
(74) *Attorney, Agent, or Firm* — Dinsmore & Shohl LLP

(57) ABSTRACT

A modular jet impingement assembly includes an inlet tube fluidly coupled to a fluid inlet, an outlet tube fluidly coupled to a fluid outlet, and a modular manifold having a first distribution recess extending into a first side of the modular manifold, a second distribution recess extending into a second side of the modular manifold, a plurality of inlet connection tubes positioned at an inlet end of the modular manifold, and a plurality of outlet connection tubes positioned at an outlet end of the modular manifold. A first manifold insert is removably positioned within the first distribution recess, a second manifold insert is removably positioned within the second distribution recess, and a first and second heat transfer plate each removably coupled to the modular manifold. The first and second heat transfer plates each comprise an impingement surface.

20 Claims, 19 Drawing Sheets

(56) References Cited

U.S. PATENT DOCUMENTS

| | | | |
|---|---|---|---|
| 5,548,907 A * | 8/1996 | Gourdine | B01J 19/2405 34/448 |
| 6,213,195 B1 * | 4/2001 | Downing | H01L 23/46 165/80.4 |
| 6,434,003 B1 * | 8/2002 | Roy | H05K 7/20927 165/104.22 |
| 6,830,619 B2 | 12/2004 | Shirley | |
| 7,128,140 B2 * | 10/2006 | Barmoav | H01L 23/467 165/185 |
| 7,173,823 B1 * | 2/2007 | Rinehart | F28D 9/0031 165/80.4 |
| 7,190,580 B2 | 3/2007 | Bezama | |
| 7,320,457 B2 * | 1/2008 | Heim | F04B 35/045 239/601 |
| 7,353,859 B2 | 4/2008 | Stevanovic et al. | |
| 7,450,378 B2 * | 11/2008 | Nelson | H01L 23/4735 165/104.33 |
| 7,703,742 B2 * | 4/2010 | Heim | F16K 99/0001 239/597 |
| 7,876,561 B2 * | 1/2011 | Schnetzka | F25B 49/025 180/297 |
| 7,886,816 B2 | 2/2011 | Ouyang | |
| 8,120,915 B2 | 2/2012 | Pautsch et al. | |
| 8,208,258 B2 | 6/2012 | Campbell | |
| 8,263,006 B2 | 9/2012 | Sutherland | |
| 8,358,000 B2 | 1/2013 | Beaupre et al. | |
| 8,495,890 B2 * | 7/2013 | Jadric | H05K 7/20936 62/259.2 |
| 8,564,952 B2 | 10/2013 | Campbell et al. | |
| 8,616,267 B2 | 12/2013 | Capriz et al. | |
| 8,650,886 B2 | 2/2014 | Wilcoxon et al. | |
| 8,810,026 B2 | 8/2014 | Kadoguchi et al. | |
| 8,897,010 B2 | 11/2014 | Shepard | |
| 8,938,988 B2 | 1/2015 | Yanik et al. | |
| 9,042,100 B2 * | 5/2015 | Kang | H05K 7/20 257/713 |
| 9,538,692 B2 * | 1/2017 | Sliech | H05K 7/20927 |
| 2002/0070745 A1 | 6/2002 | Johnson | |
| 2003/0121649 A1 | 7/2003 | Seiler | |
| 2004/0085402 A1 * | 5/2004 | Silverbrook | B41J 2/14427 347/54 |
| 2005/0241806 A1 | 11/2005 | Liu | |
| 2006/0250773 A1 * | 11/2006 | Campbell | H01L 23/4735 361/699 |
| 2008/0213133 A1 * | 9/2008 | Wallace | B01L 3/5023 422/82.05 |
| 2008/0264604 A1 * | 10/2008 | Campbell | F28F 3/02 165/80.4 |
| 2008/0277095 A1 | 11/2008 | Zhai | |
| 2009/0306633 A1 * | 12/2009 | Trovato | A61B 1/041 604/891.1 |
| 2010/0032142 A1 | 2/2010 | Copeland | |
| 2012/0138281 A1 | 6/2012 | Santini | |
| 2012/0152498 A1 * | 6/2012 | Lyon | F28D 15/00 165/104.31 |
| 2012/0267086 A1 | 10/2012 | Yanik | |
| 2012/0327603 A1 * | 12/2012 | Beaupre | H01L 23/473 361/702 |
| 2013/0037732 A1 * | 2/2013 | Schapeler | F16K 31/02 251/129.06 |
| 2014/0119394 A1 * | 5/2014 | Schleuning | H01S 5/02407 372/35 |
| 2014/0168799 A1 | 6/2014 | Hubert et al. | |
| 2014/0198452 A1 * | 7/2014 | Brunschwiler | H05K 13/0023 361/699 |
| 2014/0261644 A1 * | 9/2014 | Brown | H02S 10/30 136/253 |
| 2014/0268571 A1 | 9/2014 | Kang | |
| 2015/0075755 A1 | 3/2015 | Arvelo et al. | |
| 2015/0115491 A1 * | 4/2015 | Altonen | B29C 45/7646 264/40.7 |
| 2015/0348869 A1 * | 12/2015 | Joshi | H01L 23/4735 361/700 |
| 2016/0242318 A1 * | 8/2016 | Krug, Jr. | H05K 7/20772 |

OTHER PUBLICATIONS

Mohammadi, M., et al. (2013). "Numerical study of flow uniformity and pressure characteristics within a microchannel array with triangular manifolds." Computers & Chemical Engineering, 52(0): 134-144.

Husain, A. and K. Kwang-Yong (2013). "Design Optimization of Manifold Microchannel Heat Sink Through Evolutionary Algorithm Coupled With Surrogate Model." Components, Packaging and Manufacturing Technology, IEEE Transactions on 3(4): 617-624.

Wang, Y. and G. F. Ding (2008). "Experimental investigation of heat transfer performance for a novel microchannel heat sink." Journal of Micromechanics and Microengineering, 18(3): 035021.

"Liquid Cooling"; Fujikura. http://rd.kek.jp/slides/20130702/Thermal-4.pdf; Jul. 2, 2003.

"Parallel and series cooling method at flat type plate of mold base," http://mould-technology.blogspot.com/2008/02/paralel-and-series-cooling-methode-at.html.

International Search Report for Application No. PCT/US15/64678 dated Feb. 3, 2016.

\* cited by examiner

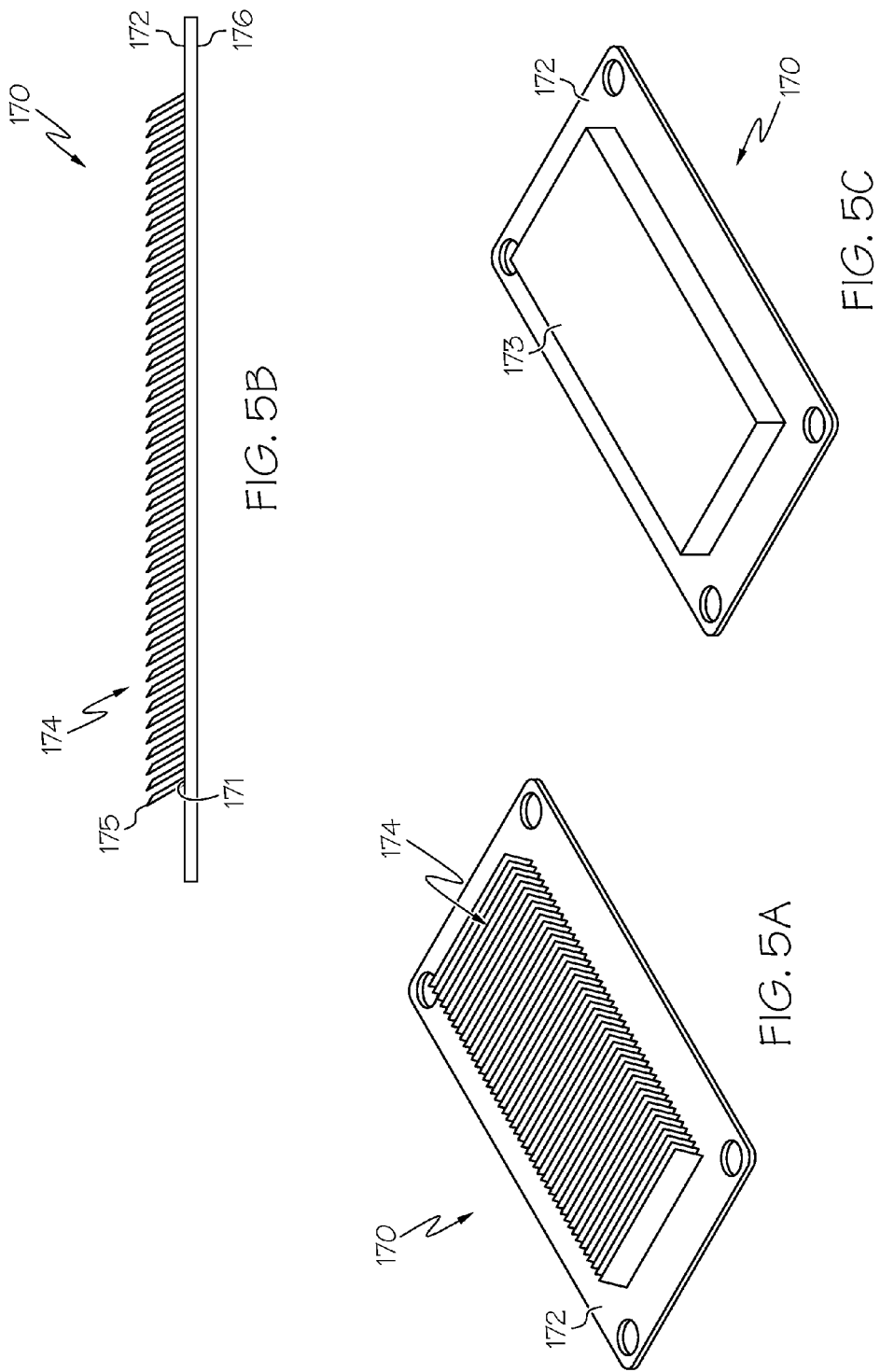

CONFIGURABLE DOUBLE-SIDED MODULAR JET IMPINGEMENT ASSEMBLIES FOR ELECTRONICS COOLING

STATEMENT OF GOVERNMENT INTEREST

The subject matter of the present disclosure was developed with government support under Department of Energy Cooperative Agreement DE-EE0006429 awarded by the U.S. Department of Energy. Accordingly, the government has certain rights in the subject matter of the present disclosure.

TECHNICAL FIELD

The present specification generally relates to jet impingement assemblies and, more particularly, to configurable, double-sided modular jet impingement assemblies.

BACKGROUND

Heat management devices may be coupled to a heat generation device, such as a power electronics device, to remove heat and lower the operating temperature of the heat generating device. A cooling fluid may be introduced to the heat management device, where it receives heat from the heat management device, primarily through convective and/or conductive heat transfer. The cooling fluid is then removed from the heat management device, thereby removing heat from the heat generating device. In one example, fluid may be directed in a jet in a localized region at a high velocity such that the fluid impinges a surface of the heat management device coupled to the heat generating device. As power electronic devices are designed to operate at increased power levels, the power electronics devices generate an increased corresponding heat flux. The increase in heat flux generated by the power electronics devices may render conventional heat sinks inadequate to reject sufficient heat to maintain a desired operating temperature in the power electronics device. Further, as power electronics modules are incorporated into increasingly compact and variable arrangements, more configurable cooling assemblies are desired.

Accordingly, heat management devices that incorporate passive and active fluid flow control and configurable, targeted cooling within jet impingement assemblies may be desired to mitigate high temperature operation of the power electronics devices.

SUMMARY

In one embodiment, a modular jet impingement assembly includes an inlet tube fluidly coupled to a fluid inlet, an outlet tube fluidly coupled to a fluid outlet, and a modular manifold having a first distribution recess extending into a first side of the modular manifold, a second distribution recess extending into a second side of the modular manifold, and a plurality of inlet connection tubes positioned at an inlet end of the modular manifold. At least one inlet connection tube is angled with respect to a surface of the modular manifold, at least one inlet connection tube fluidly couples the inlet tube to the first distribution recess, and at least one inlet connection tube fluidly couples the inlet tube to the second distribution recess. The modular jet impingement assembly further includes a plurality of outlet connection tubes positioned at an outlet end of the modular manifold. At least one outlet connection tube fluidly couples the outlet tube to the first distribution recess and at least one outlet connection tube that fluidly couples the outlet tube to the second distribution recess. The modular jet impingement assembly further includes a first manifold insert removably positioned within the first distribution recess, a second manifold insert removably positioned within the second distribution recess, and a first heat transfer plate and a second heat transfer plate each removably coupled to the modular manifold. The first and second heat transfer plates each comprise an impingement surface.

In another embodiment, a power electronics module includes a modular jet impingement assembly having an inlet tube fluidly coupled to a fluid inlet, an outlet tube fluidly coupled to a fluid outlet, and a modular manifold having a first distribution recess extending into a first side of the modular manifold, a second distribution recess extending into a second side of the modular manifold, and a plurality of inlet connection tubes positioned at an inlet end of the modular manifold. At least one inlet connection tube is angled with respect to a surface of the modular manifold, at least one inlet connection tube fluidly couples the inlet tube to the first distribution recess, and at least one inlet connection tube fluidly couples the inlet tube to the second distribution recess. The modular jet impingement assembly further includes a plurality of outlet connection tubes positioned at an outlet end of the modular manifold. At least one outlet connection tube fluidly couples the outlet tube to the first distribution recess and at least one outlet connection tube that fluidly couples the outlet tube to the second distribution recess. The modular jet impingement assembly further includes a first manifold insert removably positioned within the first distribution recess, a second manifold insert removably positioned within the second distribution recess, and a first heat transfer plate and a second heat transfer plate each removably coupled to the modular manifold. The first and second heat transfer plates each comprise an impingement surface. The power electronics module further includes an electronics device positioned in thermal contact with the first heat transfer plate.

In yet another embodiment, a power electronics module including a modular jet impingement assembly having an inlet tube fluidly coupled to a fluid inlet, an outlet tube fluidly coupled to a fluid outlet, and a modular manifold having a distribution recess extending the modular manifold and fluidly coupled to the inlet tube and the outlet tube. A manifold insert is removably positioned within the distribution recess. The power electronics module further includes a heat transfer plate comprising an impingement surface. A bracket extends along a length of the heat transfer plate to removably couple the heat transfer plate to the modular manifold. An electronics device is positioned in thermal contact with the heat transfer plate adjacent the bracket.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 5A schematically depicts an isometric view of a heat transfer plate positioned such that an impingement surface of the heat transfer plate having an array of fins is visible according to one or more embodiments shown or described herein;

FIG. 5B schematically depicts a side view of a heat transfer plate having a tilted array of fins is visible according to one or more embodiments shown or described herein;

FIG. 5C schematically depicts an isometric view of a heat transfer plate positioned such that an impingement surface of the heat transfer plate having an impingement block is visible according to one or more embodiments shown or described herein;

DETAILED DESCRIPTION

Embodiments of the present disclosure are directed to power electronics modules having modular jet impingement assemblies and apparatuses that are utilized to cool heat generating devices, such as semiconductor devices. The modular jet impingement assemblies include a modular manifold configured to receive manifold inserts into two sides of the modular manifold. Thermally conductive heat transfer plates having an impingement surface and a heat transfer surface may be coupled to two sides of the modular manifold, for example, opposite the manifold inserts. The impingement surface may comprise an array of fins or an impingement block and the heat transfer surface that may be thermally coupled to a heat generating device. When the impingement surface comprises an array of fins, heat is transferred to a coolant fluid as jets of the coolant fluid impinge the impingement surface. By selectively positioning heat transfer plates having arrays of fins or impingement blocks opposite manifold inserts on two sides of the modular manifold, the modular jet impingement assemblies may be configurable to provide targeted cooling to various arrangements of heat generating devices. The modular jet impingement assemblies may also be configured to actively and/or passively alter the mass flow rate of coolant fluid flowing along a fluid flow path formed within the modular jet impingement assemblies, which may facilitate uniform heat transfer and/or targeted heat transfer from the heat generating devices to the coolant fluid thereby removing heat flux from the heat generating devices and increasing the operating life of the heat generating devices.

Figure 1:
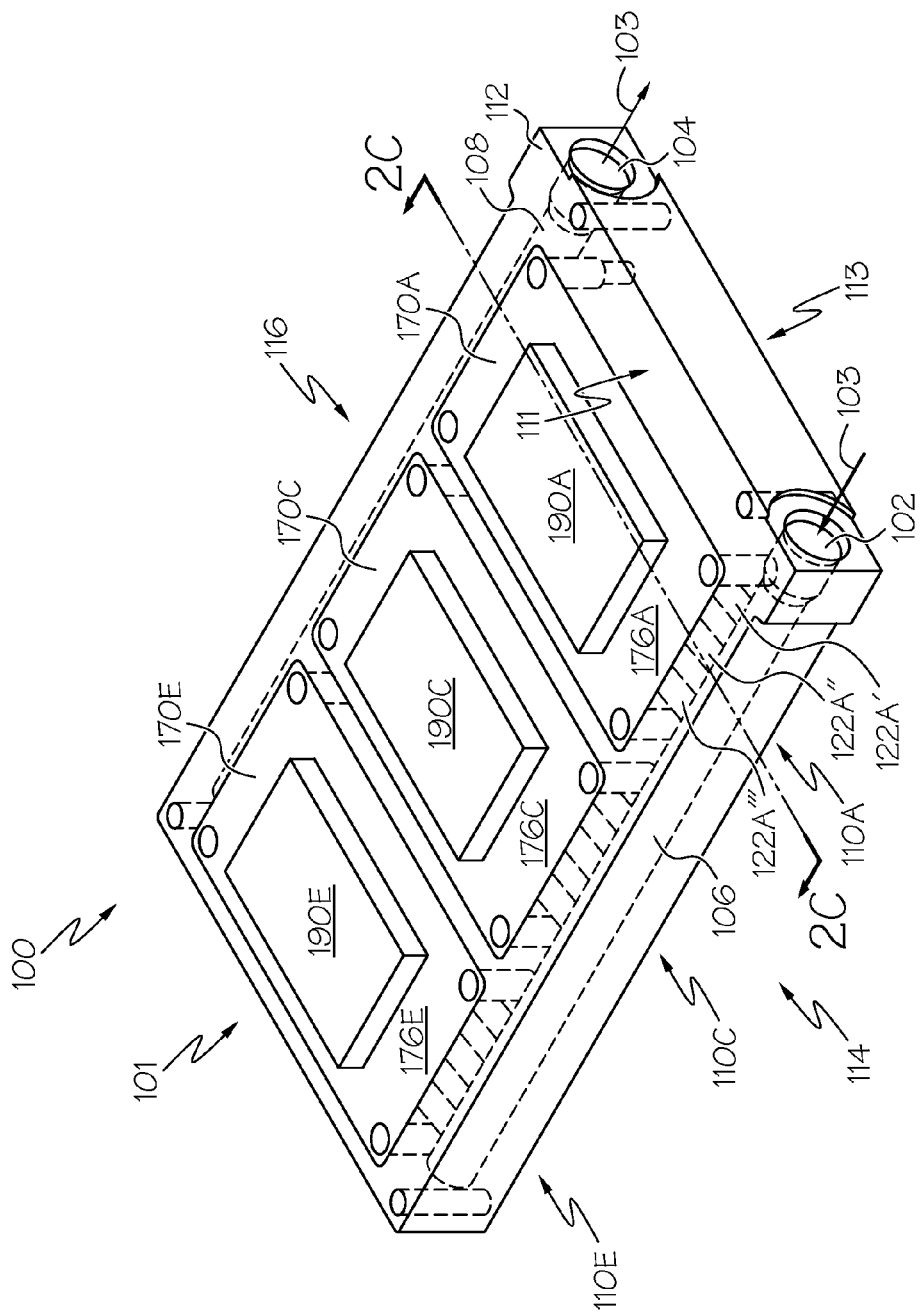
FIG. 1 schematically depicts an isometric view of an example power electronics module according to one or more embodiments shown or described herein.
Figure 2A:
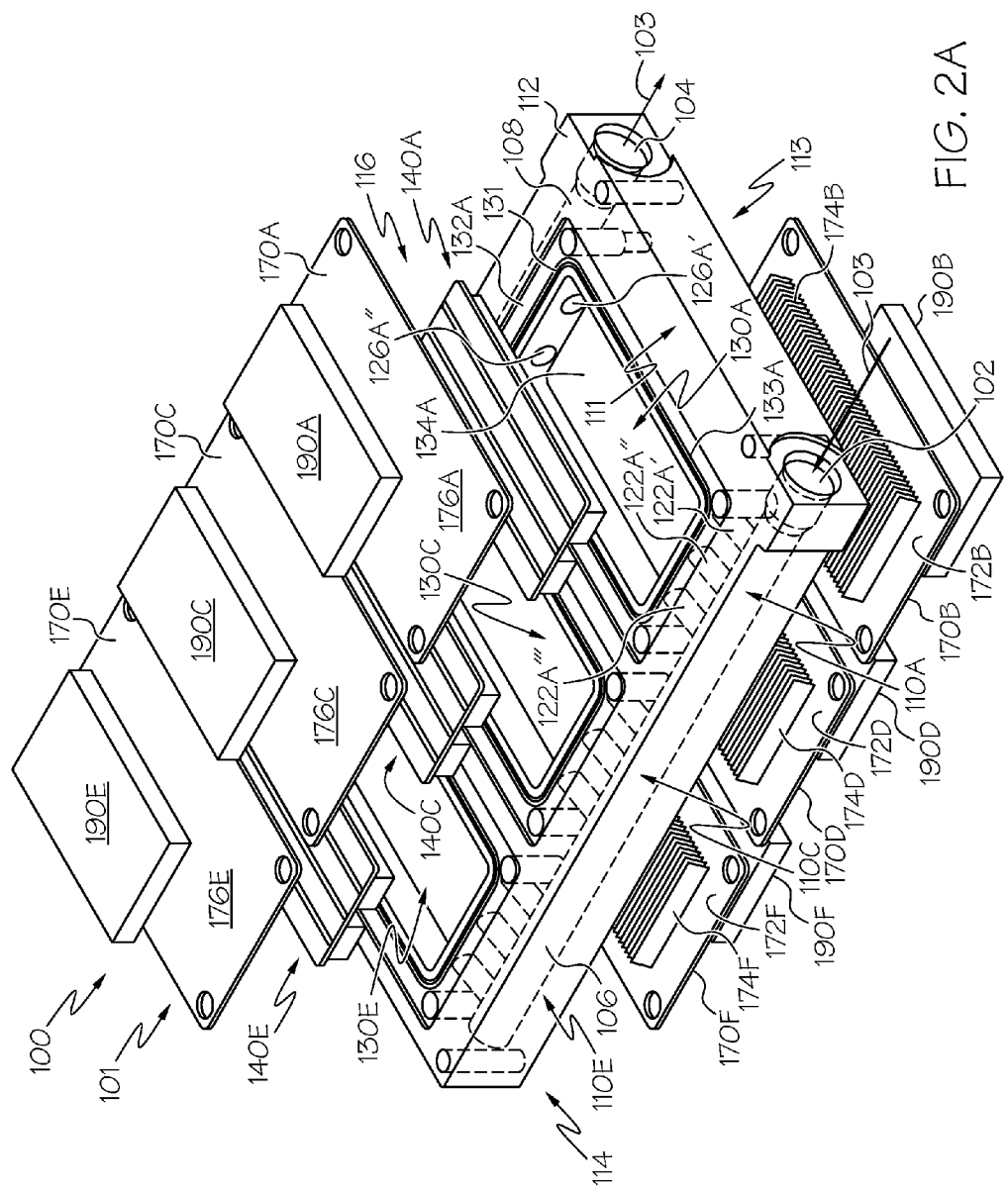
FIG. 2A schematically depicts an exploded isometric view of a first side the power electronics module as shown in FIG. 1 according to one or more embodiments shown or described herein.
Figure 2B:
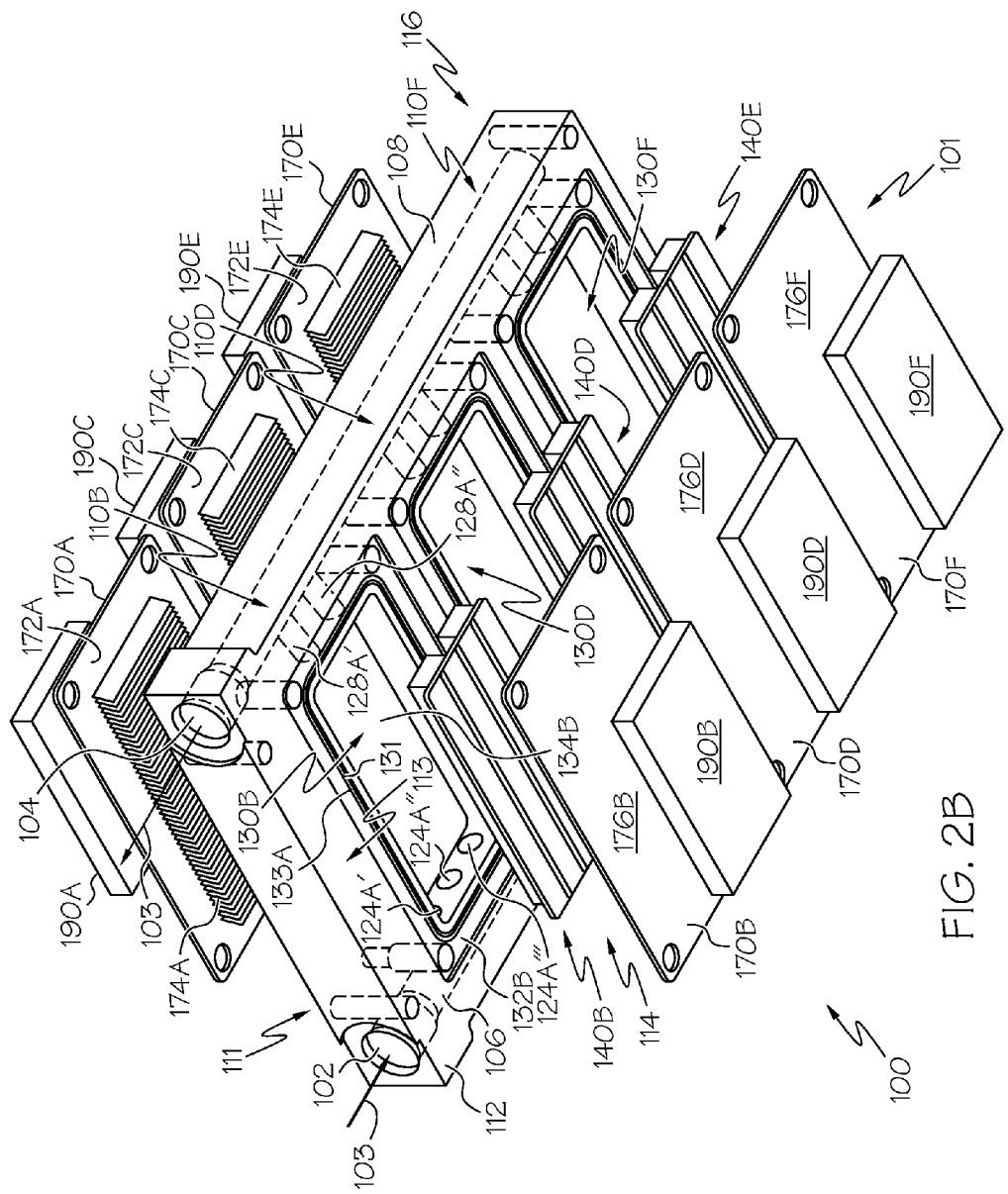
FIG. 2B schematically depicts an exploded isometric view of a second side the power electronics module as shown in FIG. 1 according to one or more embodiments shown or described herein.
Figure 2C:
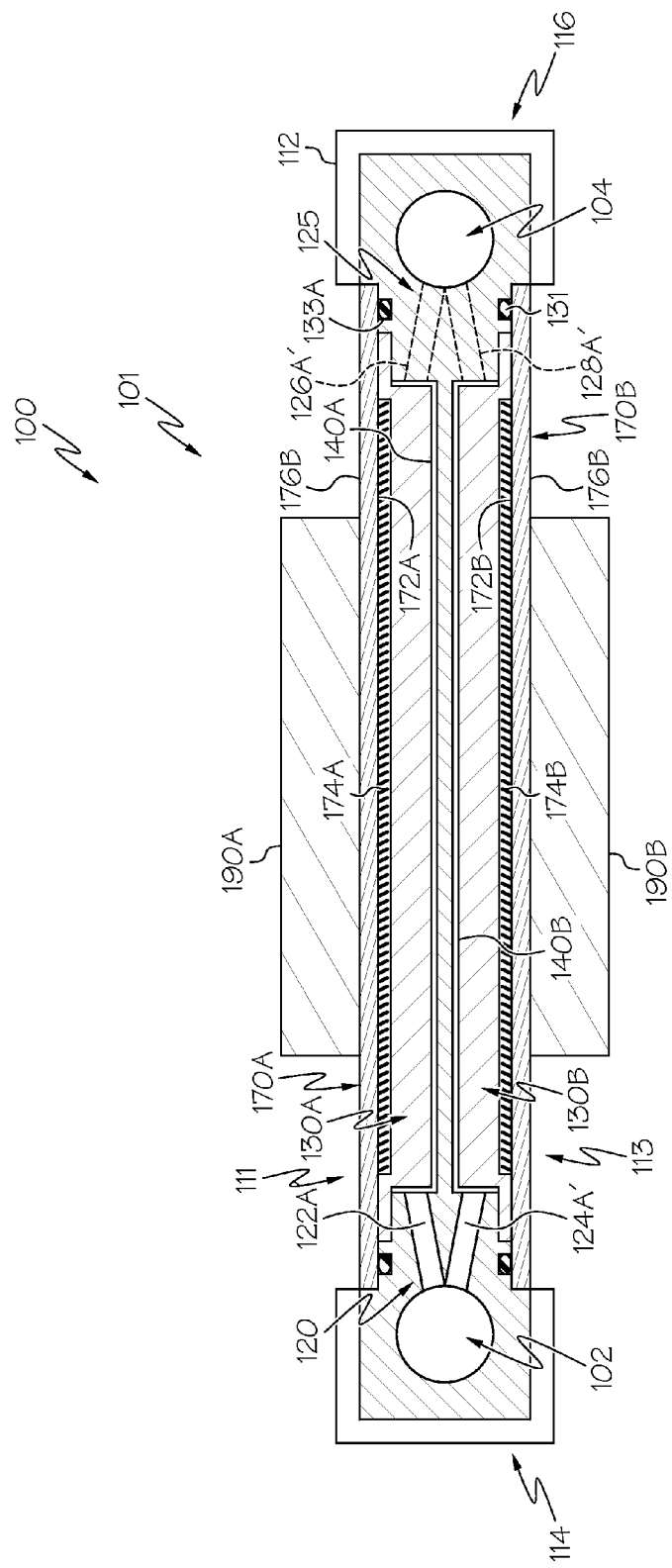
FIG. 2C schematically depicts a sectional view of the power electronics modules as shown in FIG. 1 according to one or more embodiments shown or described herein.
Figure 3:
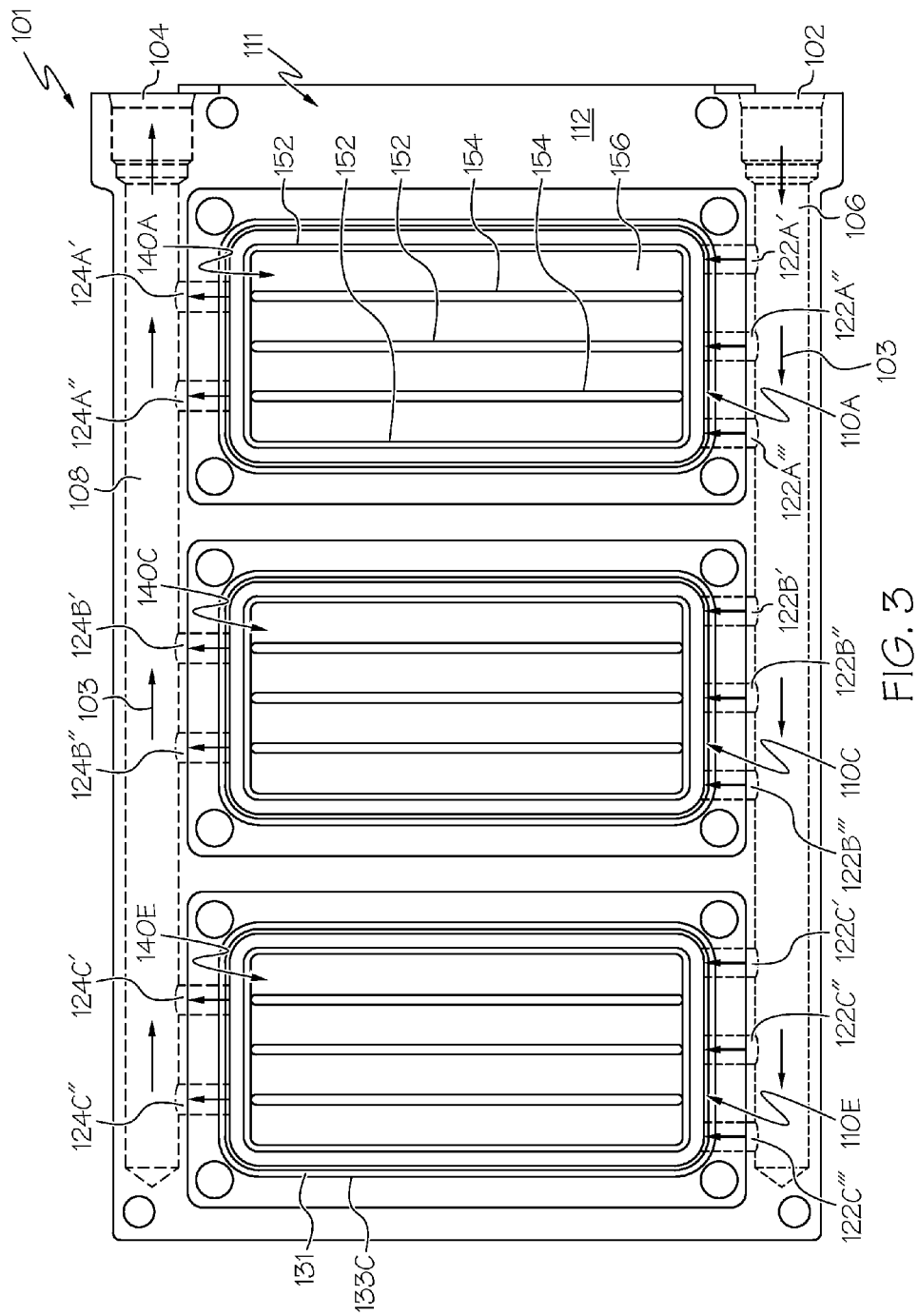
FIG. 3 schematically depicts a top view of an example modular jet impingement assembly according to one or more embodiments shown or described herein.

Referring to FIGS. 1-3, an exemplary power electronics module 100 includes a modular jet impingement assembly 101 that may be thermally coupled to one or more heat generating devices 190. The modular jet impingement assembly 101 comprises a fluid inlet 102, a fluid outlet 104, an inlet tube 106, an outlet tube 108, one or more modular manifolds 110, and one or more manifold inserts 140 disposed within one or more distribution recesses 130. The one or more distribution recesses each extend into one of a first side 111 or a second side 113 of the one or more modular manifolds 110. The modular jet impingement assembly 101 further comprises one or more heat transfer plates 170. In the embodiment depicted in FIGS. 1-3, the modular jet impingement assembly 101 comprises a first modular manifold 110A, a second modular manifold 110B, and a third modular manifold 110C integrally connected such that the inlet tube 106 and the outlet tube 108 extend through each of the modular manifolds 110A-110C. In other embodiments, (for example, the embodiment depicted in FIGS. 8-15B), the modular manifolds 110A-110C are removably coupled. It should be understood that any number of modular manifolds 110 are contemplated and the three modular manifold (110A-110C) embodiment is described herein merely as an illustrative embodiment.

In some embodiments, each modular manifold 110A-110C may be made from a generally thermally conductive material, for example and without limitation, copper, aluminum, steel, thermally enhanced composite materials, polymeric composite materials, graphite, molded plastic, or the like. Additionally, the modular jet impingement assembly 101, including each modular manifold 110A-110C, may be manufactured using 3D printing, additive manufacturing, and the like, for example, fusion deposition modeling. Further, it should be understood that throughout this disclosure, the first modular manifold 110A, and components associated therewith are described for illustrative purposes and the description may apply to any of the one or more modular manifolds 110.

Referring still to FIGS. 1-3, the inlet tube 106 is positioned on an inlet side 114 of the modular jet impingement assembly 101 and fluidly couples the fluid inlet 102 and the modular manifolds 110A-110C. The outlet tube 108 is positioned on an outlet side 116 of the modular jet impingement assembly 101 and fluidly couples the fluid outlet 104 and the modular manifolds 110A-110C. In the embodiments depicted in FIGS. 1-3, the inlet tube 106 and the outlet tube 108 includes a single tube extending along the modular manifolds 110A-110C. Further, in embodiments in which the modular manifolds 110A-110C are removably coupled together (FIGS. 8-15B), each individual modular manifold 110 includes a portion of the inlet tube 106 and a portion of the outlet tube 108 fluidly coupled to the fluid outlet 104.

As described in more detail below, a coolant fluid enters the modular jet impingement assembly 101 through the fluid inlet 102 and exits the modular jet impingement assembly 101 through the fluid outlet 104. The modular jet impingement assembly 101 may be fluidly coupled to a coolant reservoir (not shown), for example, and in operation the coolant fluid follows a fluid flow path 103 and traverse the inlet tube 106, the modular manifolds 110A-110C, one or more manifold inserts 140A-140F, contacts one or more heat transfer plates 170A-170F, and exits through the outlet tube 108. The coolant fluid may be any appropriate liquid, such as deionized water or radiator fluid. In some embodiments, the coolant fluid is a mixture of water and ethylene glycol, for example, a 50/50 mixture. Other exemplary fluids include, for example and without limitation, organic solvents, and inorganic solvents. Examples of such solvents may include commercial refrigerants such as R-134a, R717, and R744. Selection of the composition of the coolant fluid used in association with the power electronics module 100 may be selected based on, among other properties, the boiling point, the density, and the viscosity of the fluid.

Referring now to FIGS. 2A-2C, each modular manifold 110A-110C comprises at least one distribution recesses 130A-130F, for example, two or more distribution recesses 130A-130F. FIG. 2A is an exploded isometric view of the power electronics module 100, depicting the first side 111 of the modular jet impingement assembly 101, while FIG. 2B is an exploded isometric view the power electronics module 100, depicting the second side 113 of the modular jet impingement assembly 101. Further, FIG. 2C is a sectional view of the power electronics module 100. In the embodiments depicted in FIGS. 2A and 2B, each modular manifold 110A-110C has a first distribution recess 130A, 130C, 130E extending into the first side 111 of the modular manifolds 110A-110C and a second distribution recess 130B, 130D, 130F extending into the second side 113 of modular manifolds 110A-110C, adjacent the first distribution recess 130A. In some embodiments, the first side 111 is opposite the second side 113 such that the first and second distribution recesses 130A, 130B extend into opposite sides 111, 113 of the modular manifolds 110A-110C. Further, each distribution recess 130A-130F may be positioned between the inlet side 114 and the outlet side 116 of the modular jet impingement assembly 101 and may be fluidly coupled to the inlet tube 106 on the inlet side 114 and the outlet tube 108 on the outlet side 116.

Referring specifically to the first distribution recess 130A for ease of description, the first distribution recess 130A comprises an insert receiving portion 134A and a heat transfer plate receiving portion 132A. The heat transfer plate receiving portion 132A circumscribes the insert receiving portion 134A. As described below, the insert receiving portion 134A is configured to receive and house a first manifold insert 140A and the heat transfer plate receiving portion 132A is configured to receive and house a first heat transfer plate 170A, positioned proximate and covering the first manifold insert 140A. The first distribution recess 130A may also include a gasket recess 133A extending into the heat transfer plate receiving portion 132A. The gasket recess 133A is configured to receive a gasket 131A, such as an o-ring, to help fluidly seal a heat transfer plate 170A to the modular manifold 110A, as described in more detail below. Further, it should be understood that each distribution recess 130A-130F may comprise the components described above with respect to first distribution recess 130A.

Referring still to first modular manifold 110A, one or more groups of inlet connection tubes 122A'-122A''' and 124A'-124A''' are positioned at the inlet side 114 of the first modular manifold 110A. In some embodiments, a first group of inlet connection tubes 122A'-122A''' extend between and fluidly connect the inlet tube 106 and the first distribution recess 130A and provide an inlet path for coolant fluid entering the first distribution recess 130A. Further, in embodiments in which the first modular manifold 110A includes the second distribution recess 130B, the first modular manifold 110A has a second group of inlet connection tubes 124A'-124A''' that extend between and fluidly connect the inlet tube 106 and the second distribution recess 130B, providing an inlet path for coolant fluid entering the second distribution recess 130B. While each group of inlet connection tubes are depicted comprising three individual inlet connection tubes 122A'/124A', 122A"/124A", and 122A'''/124A''', it should be understood the each group of inlet connection tubes may comprise any number of individual inlet connection tubes 122/124.

The first modular manifold 110A also includes one or more groups of outlet connection tubes 126A'-126A" and 128A'-128A" positioned at the outlet side 116 of the first modular manifold 110A. In some embodiments, a first group of outlet connection tubes 126A'-126A" extend between and fluidly connect the first distribution recess 130A and the outlet tube 108 and provide an outlet path for coolant fluid exiting the first distribution recess 130A. Further, in embodiments in which the first modular manifold 110A has a second distribution recess 130B, the first modular manifold 110A includes a second group of outlet connection tubes 128A'-128A" that extend between and fluidly connect the second distribution recess 130B and the outlet tube 108, providing an outlet path for coolant fluid exiting the second distribution recess 130B. While each group of outlet connection tubes are depicted comprising two individual outlet connection tubes 126A'/128A' and 126A"/128A", and it should be understood the each group of outlet connection tubes may comprise any number of individual outlet connection tubes 126/128. Further, it should be understood that descriptions of the first and second groups of inlet connection tubes 122A'-122A''' and 124A'-124A''' and the first and second groups of outlet connection tubes 126A'-126A" and 128A'-128A" of the first modular manifold 110A may also describe the embodiments of the corresponding components of the second modular manifold 110B, the third modular manifold 110C, and any additional modular manifolds 110.

In some embodiments, each individual inlet connection tube 122A'-122A''', 124A'-124A''' may be angled with respect to a surface 112 of the first modular manifold 110A, for example, between about 5° and about 25°, such as, for example, about 10°, about 15°, and about 20°. The first group of inlet connection tubes 122A'-122A''' may be angled from the inlet tube 106 toward the first side 111 of the first modular manifold 110A and the second group of inlet connection tubes 124A'-124A''' may be angled from the inlet tube 106 toward the second side 113 of the first modular manifold 110A, for example, opposite the first group of inlet connection tubes 122A'-122A'''. In other embodiments, one or both of the first and second groups of inlet connection tubes 122A'-122A''', 124A'-124A''' may not be angled with respect to a surface 112 of the first modular manifold 110A.

The angles of the individual inlet connection tubes of the first and second groups of inlet connection tubes 122A'-122A''', 124A'-124A''' may be uniform or non-uniform with respect to each other. In some embodiments, the first group of inlet connection tubes 122A'-122A''' may extend toward the first side 111 at the same angle with respect to the surface 112 that the second group of inlet connection tubes 124A'-124A''' extends toward the second side 113. In some embodiments, the first group of inlet connection tubes 122A'-122A''' may extend outward from the inlet tube 106 toward the first side 111 at a different angle with respect to the surface 112 than the second group of inlet connection tubes 124A'-124A''' extend toward the second side 113. Further, the angle of the each individual inlet connection tube 122A'-122A''', 124A'-124A''' of the first modular manifold 110A may be the same or different than the angles of the individual inlet connection tubes 122B'-122B''', 124B'-124B''' of the second modular manifold 110A and may be the same or different than the angles than the individual inlet connection tubes 122C'-122C''', 124C'-124C''' of the third modular manifold 110C, respectively. It should be understood that any combination of angles are contemplated.

In operation, by angling the individual inlet connection tubes 122'-122''', 124'-124''', the flow resistance of the fluid flow path 103 may be altered. For example, individual inlet connection tubes 122'-122''', 124'-124''', having larger angles may provide more flow resistance than inlet connection tubes 122'-122''', 124'-124''', having smaller angles. In some embodiments, it may be desirable to provide inlet connection tubes 122'-122''', 124'-124''', having angles that facilitate uniform flow resistances and uniform mass flow rates and, in other embodiments, it may be desirable to provide inlet connection tubes 122'-122''', 124'-124''', having angles that facilitate non-uniform flow resistances and non-uniform mass flow rates, for example, to provide targeted cooling to one or more heat generating devices 190.

Referring now to FIGS. 2C and 3, the geometry, for example, the cross sectional area, the diameter, or the like, of each individual inlet connection tube 122'-122''', 124'-124''' may provide passive mass flow rate control of the fluid flow path 103 through the modular jet impingement assembly 101. In some embodiments, the diameters of each individual inlet connection tube 122'-122''', 124'-124''' of one modular manifold 110 (e.g., the first modular manifold 110A) are uniform or non-uniform. In some embodiments, the diameters of each inlet connection tube 122'-122''', 124'-124''' of one individual modular manifold 110 (e.g., the first modular manifold 110A) may be non-uniform with respect to each inlet connection tube 122'-122''', 124'-124''' of another individual modular manifold 110 (e.g., the second modular manifold 110B). Further, the diameters of each inlet connection tube 122'-122''', 124'-124''' may be non-uniform with respect to all inlet connection tubes 122'-122''', 124'-124''' within the modular jet impingement assembly 101 (e.g., the inlet connection tubes 122'-122''', 124'-124''' associated with the first modular manifold 110A, the second modular manifold 110B, and the like). In some embodiments, the inlet connection tubes 122'-122''', 124'-124''' may be any contemplated diameter, for example, between about 2-10 mm, such as about 3 mm, 5 mm, and 7 mm.

In some embodiments, the diameter of each individual inlet connection tube 122'-122''', 124'-124''' may be computationally determined by an optimization process, for example, the diameter of each individual inlet connection tube 122'-122''', 124'-124''' may be optimized to control the mass flow rate of the coolant fluid along the fluid flow path 103. The diameter of each individual inlet connection tube 122'-122''', 124'-124''' may facilitate uniform coolant fluid flow into each modular manifold 110A-110C or facilitate targeted coolant fluid flow into the distribution recesses 130A-130F of the modular manifolds 110A-110C to provide more or less cooling to different heat generating devices 190A-190F thermally coupled to the modular manifolds 110A-110F. Similarly, the diameter of each individual inlet connection tube 122'-122''', 124'-124''' may vary based on the cooling requirements of a particular application. For example, smaller diameters may be used to provide less coolant fluid into individual distribution recess 130A-130F positioned proximate one or more heat generating devices 190A-190F requiring less heat transfer or not positioned proximate a heat generating device 190A-190F and larger diameters may be used to provide more coolant fluid into distribution recess 130A-130F positioned proximate one or more heat generating devices 190A-190F requiring more heat transfer.

In some embodiments, the diameters of respective inlet connection tubes 122'-122''', 124'-124''' of each modular manifold 110A-110C are smaller the farther the modular manifold 110A-110C is from the fluid inlet 102. This may create a more uniform mass flow rate through each modular manifold 110A-110C, which allows coolant fluid to be applied evenly to each modular manifold 110A-110C, for example, to provide uniform cooling to one or more heat generating devices 190. In other embodiments, the diameters of respective inlet connection tubes 122'-122''', 124'-124''' of each modular manifold 110A-110C are uniform across the modular manifolds 110A-110C. This may create a non-uniform mass flow rate through each modular manifold 110A-110C. The non-uniform mass flow rate through each modular manifold 110A-110C allows more coolant fluid to be applied to modular manifolds 110A-110C nearer the fluid inlet 102, for example to provide targeted cooling to one or more heat generating devices 190A-190F. It should be understood that by altering the diameters of the inlet connection tubes 122, the mass flow rate of the coolant fluid traversing the modular manifolds 110 may be altered.

Additionally, in some embodiments, the mass flow rate of the coolant fluid along the fluid flow path 103 may be altered by one or more porous media portions positioned within the inlet tube 106, the outlet tube 108, and/or one or more inlet connection tubes 122'-122''', 124'-124'''. The one or more porous media portions alter the porosity of the fluid flow path 103 and alter the mass flow rate of coolant fluid through the modular jet impingement assembly 101. The porous media portions may comprise a cylindrical porous media having a diameter substantially similar to the inlet tube 106. In some embodiments, one or more porous media portions may be positioned within the one or more inlet connection tubes 122'-122''', 124'-124'''. Porous media portions may be, for example, a metal foam, a porous ceramic, a porous glass, and/or a porous plastic, for example, polyethylene, polypropylene, polytetrafluoroethylene, polyvinylidene, ethyl vinyl acetate, and the like.

Referring now to FIGS. 2A-5B, the modular jet impingement assembly 101 further comprises one or more manifold inserts 140 removably positioned within the distribution recesses 130 of each individual modular manifold 110. In the embodiments depicted in FIGS. 2A-5B, six manifold inserts 140A-140F are depicted, however, it should be understood that any number of manifold inserts 140 are contemplated. In some embodiments, each individual manifold insert 140 may be removably positioned within an individual distribution recess 130 of each individual modular manifold 110 (e.g., the first or second distribution recesses 130A, 130B of the first modular manifold 110A. In other embodiments, multiple manifold inserts 140 may be removably positioned within an individual distribution recess 130. In the embodiment depicted in FIGS. 2A-2C, a first manifold insert 140A is removably positioned within the first distribution recess 130A of the first modular manifold 110A and a second manifold insert 140B is removably positioned with the second distribution recess 130B of the first modular manifold 110A. Additional manifold inserts 140C-140F may be positioned within the additional distribution recesses 130C-130F.

Figure 4A:
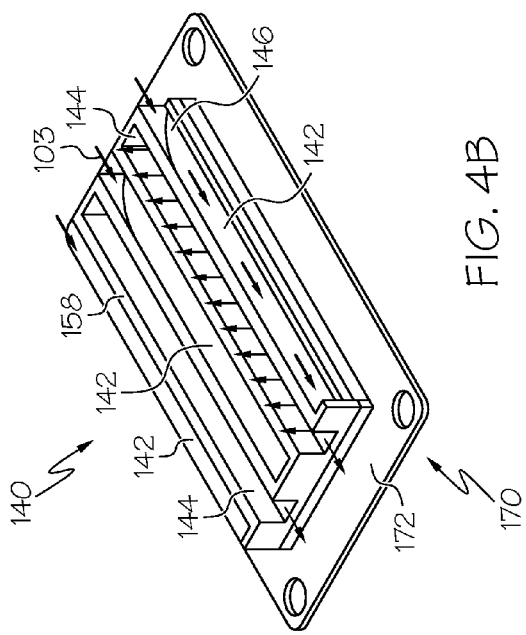
FIG. 4A schematically depicts an isometric view of a manifold insert positioned adjacent a heat transfer plate according to one or more embodiments shown or described herein.
Figure 4C:
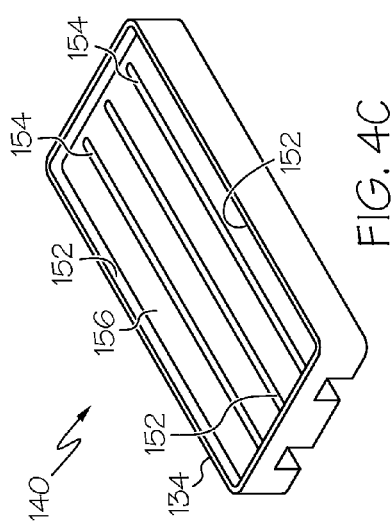
FIG. 4C schematically depicts an isometric view of an embodiment of the manifold insert depicting a slot surface of the manifold insert according to one or more embodiments shown or described herein.
Figure 4B:
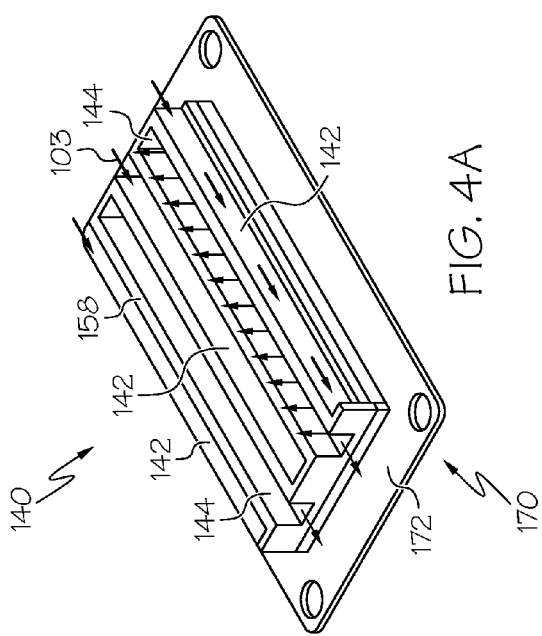
FIG. 4B schematically depicts an isometric view of another embodiment of a manifold insert positioned adjacent a heat transfer plate according to one or more embodiments shown or described herein.

Referring now to FIGS. 4A and 4B, isometric views of two exemplary manifold inserts 140 are depicted. The manifold inserts 140 each have one or more inlet branch channels 142 and one or more outlet branch channels 144. The one or more inlet branch channels 142 are fluidly coupled to the one or more inlet connection tubes 122'-122''', 124'-124''' when the individual manifold insert 140 is positioned within an individual distribution recess 130 of an individual modular manifold 110, thereby defining a portion of the fluid flow path 103. Further, the one or more outlet branch channels 144 are fluidly coupled to the one or more outlet connection tubes 126, 128 when the individual manifold insert 140 is positioned within the distribution recess 130 of the individual modular manifold 110, thereby defining another portion of the fluid flow path 103. The one or more inlet branch channels 142 and the one or more outlet branch channels 144 may be alternately positioned within the manifold insert 140 such that each inlet branch channel 142 is positioned adjacent at least one outlet branch channel 144 and each outlet branch channel 144 is positioned adjacent at least one inlet branch channel 142. Further, the manifold inserts 140 have a channel surface 158 positioned proximate the distribution recess 130 when the manifold insert 140 is disposed within the distribution recess 130 and a slot surface 156 (FIG. 4C) positioned proximate the heat transfer plate 170 (e.g., an impingement surface 172 of the heat transfer plate 170) when the heat transfer plate 170 is coupled to the modular manifold 110.

In some embodiments, for example the embodiment depicted in FIG. 4B, one or more of the inlet branch channels 142 may comprise one or more tapered portions 146. For example, an individual tapered portion 146 may be aligned with an individual inlet connection tube 122'-122''', 124'-124''' and may be configured to alter the mass flow rate of coolant fluid traversing the fluid flow path 103. Further, in other embodiments, one or more of the outlet branch channels 144 may also comprise one or more tapered portions. It should be understood that the one or more inlet branch channels 142 and the one or more outlet branch channels 144 may take a variety of configurations including having a variety of slopes, lengths, discontinuous portions, non-linear portions, and the like without departing from the scope of the present disclosure.

As depicted in FIGS. 4A and 4B, the plurality of manifold inserts 140 may include an uneven number of inlet branch channels 142 and outlet branch channels 144, for example, three inlet branch channels 142 each fluidly coupled to one of three inlet connection tubes 122'-122''' or 124'-124''' and two outlet branch channels 144 each fluidly coupled to one of two outlet connection tubes 126'-126''' or 128'-128'''. In some embodiments, the two outlet branch channels 144 may be wider than the three inlet branch channels 142, for example, such that the inlet and outlet branch channels 142, 144 comprise an equal total width to facilitate even coolant fluid flow through each manifold insert 140. In other embodiments, the plurality of manifold inserts 140 may comprise an even number of inlet branch channels 142 and outlet branch channels 144, for example, two pairs of inlet and outlet branch channels 142, 144, four pairs of inlet and outlet branch channels 142, 144, or the like. It should be understood that manifold inserts 140 with any number of inlet and outlet branch channels 142, 144 are contemplated. In operation, by increasing the number of inlet and outlet branch channels 142, 144, the heat transfer coefficient of the modular jet impingement assembly 101 may decrease by a small percentage while the fluid pressure in the modular jet impingement assembly 101 may decrease by a larger percentage. For example, by increasing the number of inlet and outlet branch channels 142, 144, cooling performance may decrease by about 5-20%, such as 10% (i.e. the heat transfer coefficient may decrease) and the required level of pumping power to pump coolant fluid through the modular jet impingement assembly 101 may decrease by about 60-90%, such as 80%.

Referring also to FIG. 4C, the slot surface 156 of the manifold insert 140 is depicted. The one or more manifold inserts 140 comprise one or more impinging slots 152 fluidly coupled to the one or more inlet branch channels 142 to form a throughput portion of the manifold insert 140 such that coolant fluid may pass through the impinging slot 152, for example, as jets of coolant fluid. Further, the impinging slots 152 have uniform or non-uniform shapes and cross-sectional areas and may take a variety of sizes and shapes to provide jets of coolant fluid to impinge the heat transfer plate 170, in some embodiments, to transfer heat from the heat transfer plate 170 to the coolant fluid, as described below. In operation, the impinging slots 152 may facilitate jet impingement from the manifold inserts 140 to the heat transfer plates 170.

The one or more manifold inserts 140 further comprise one or more collecting slots 154 fluidly coupled to the one or more outlet branch channels 144 to form additional throughput portions of the manifold insert 140 such that coolant fluid may pass through the collecting slots 154. The collecting slots 154 are in fluid communication with the impinging slots 152 such that coolant fluid that exits the manifold insert 140 through an individual impinging slot 152 reenters the manifold insert 140 through an individual collecting slot 154, for example, an adjacent collecting slot 154. Further, the collecting slots 154 have uniform or non-uniform shapes and cross-sectional areas and may take a variety of sizes and shapes to collect coolant fluid after it impinges the heat transfer plate 170 and transfer heat from the heat transfer plate 170.

Referring now to FIGS. 1-5C, the example modular jet impingement assembly 101 may further comprise one or more heat transfer plates 170 coupled to the one or more modular manifolds 110. In some embodiments, two one more heat transfer plates 170 are coupled to each modular manifold 110. For example, in the embodiments depicted in FIG. 2C, a first heat transfer plate 170A may be removably coupled to the first side 111 of the first modular manifold 110A, for example, proximate the first distribution recess 130A and a second heat transfer plate 170B may be removably coupled to the second side 113 of the first modular manifold 110A, for example, proximate the second distribution recess 130B. Further, additional heat transfer plates 170C-170F may be removably coupled to the first side 111 or the second side 113 of the second and third modular manifolds 110B, 110C, for example, positioned proximate the distribution recesses 130C-130F.

It should be understood that any number of modular manifolds 110 and any number of heat transfer plates 170 are contemplated. For example, in some embodiments, two or more heat transfer plates 170 may be coupled to one or both of the first side 111 and the second side 113 of the individual modular manifolds 110 and in other embodiments, an individual heat transfer plate 170 may be coupled to the first side 111 or the second side 113 of two or more modular manifolds 110. Further, the heat transfer plates 170 may also be made from a thermally conductive material, for example and without limitation, copper, aluminum, steel, thermally enhanced composite materials, polymeric composite materials, graphite, or the like.

As depicted in FIGS. 5A and 5B, the heat transfer plate 170 may comprise an impingement surface 172 having an array of fins 174. When the heat transfer plate 170 is coupled to the modular manifold 110, the array of fins 174 may extend toward the slot surface 156 of the manifold insert 140 removably positioned within one of the distribution recess 130. In some embodiments, the array of fins 174 may be proximate to the slot surface 156, and in some embodiments, the array of fins 174 may contact the slot surface 156. Further, the heat transfer plate 170 may be positioned within the heat transfer plate receiving portion 132 of the distribution recess 130 and the impingement surface 172, including the array of fins 174, extends towards the manifold insert 140 such that the array of fins 174 are positioned proximate the impinging slots 152 and the collecting slots 154 of the manifold insert 140, forming an impingement chamber therebetween. The array of fins 174 include straight fins, as depicted in FIG. 5A, tilted fins, as depicted in FIG. 5B, or a combination of both. Further, individual fins of the array of fins 174 have a tip portion 175 that is flat or sharp (FIG. 5B). When the tip portion 175 is sharp, a cross-sectional area at a base portion 171 of the individual fin may be larger than a cross-sectional area at the tip portion 175 of the individual fin. Further, when the tip portion 175 is sharp, a cross sectional area of the individual fin may decrease approaching the tip portion 175.

In operation, the array of fins 174 receive coolant fluid from the impinging slots 152 and the array of fins 174 direct coolant fluid toward the collecting slots 154. For example, in some embodiments, the impingement surface 172 may further include one or more grooves (e.g., channels) that may direct coolant fluid flow through the impingement chamber. The one or more grooves may be positioned within the array of fins 174. For example, the one or more grooves may run substantially parallel and proximate the impinging slots 152 and the collecting slots 154 of the manifold insert 140 and may direct coolant fluid between impinging slots 152 and collecting slots 154.

Referring again to FIGS. 5A and 5B, the one or more arrays of fins 174 increase the local surface area of the heat transfer plate 170, such that coolant fluid delivered to the heat transfer plate 170 may efficiently convect heat away from the heat transfer plate 170. By increasing the surface area of the heat transfer plate 170, the heat transfer rate from the heat transfer plate 170 to the coolant fluid may be enhanced. In some embodiments, the heat transfer plate 170, including the one or more arrays of fins 174, may have a variety of configurations including being made from uniform, isotropic materials, non-isotropic materials, composite materials, or the like. In some embodiments, the one or more arrays of fins 174 of the heat transfer plate 170 may include a coating, for example, a porous coating, that increases the surface area of the one or more arrays of fins 174, thereby increasing heat transfer away from the heat transfer plate 170. In some embodiments, the one or more arrays of fins 174 may be constructed from a porous material. In some embodiments, when the array of fins 174 are tilted, more surface area of each individual fin may be exposed to the coolant fluid, increasing the heat transfer coefficient of the modular jet impingement assembly 101. Further, when the tip portion 175 of the individual fins is sharp, the flow resistance through the array of fins 174 may be decreased, allowing more coolant fluid to flow through the array of fins 174.

Referring now to FIG. 5C, the heat transfer plates 170 may alternatively have an impingement block 173 positioned on the impingement surface 172, for example, in place of the array of fins 174. In this embodiment, the heat transfer plate 170 may be positioned within the heat transfer plate receiving portion 132 of the distribution recess 130 such that the impingement block 173 may extend towards the slot surface 156 of the manifold insert 140. In some embodiment, the impingement block 173 may positioned proximate the impinging slots 152 and the collecting slots 154 of the manifold insert 140, forming an impingement chamber therebetween, and in other embodiments, the impingement block 173 may contact the slot surface 156 to fluidly block the impinging slots 152 and the collecting slot 154. The impingement block 173 may comprise a non-thermally conductive material, for example, glass, fiberglass, or a plastic polymer, such as PEEK, polyurethane, polystyrene, perlite, or the like.

During the operation of some embodiments, the impingement block 173 may receive coolant fluid from the impinging slots 152 and the impingement block 173 may direct coolant fluid toward the collecting slots 154. Because the impingement block 173 comprises a non-thermally conductive material, minimal heat is transferred from the impingement block 173 to the coolant fluid. During the operation of other embodiments, the impingement block 173 may fluidly block the impinging slots 152 and the collecting slot 154. As described in more detail below, in embodiments comprising the one or more arrays of fins 174, the one or more arrays of fins 174 can correspond to the locations of the one or more heat generating devices 190 positioned proximate the heat transfer plate 170. In some embodiments, for example, when the modular jet impingement assembly 101 includes more heat transfer plates 170 than heat generating devices 190, the heat transfer plates 170 with the impingement block 173 may be coupled to the modular manifold 110 at locations on the modular jet impingement assembly without a heat generating device 190. In one example modular jet impingement assembly 101, impingement blocks 173 may be positioned on the impingement surface 172 of heat transfer plates 170 positioned along one side (e.g., the first side 111 or the second side 113) of each modular manifold 110 to convert the modular jet impingement assembly 101 from a two-sided jet impingement assembly to a single-sided jet impingement assembly, e.g., one that provides cooling to heat generating devices 190 positioned along only one side of the modular manifolds 110.

Referring again to FIGS. 1-2C, a heat transfer surface 176 of the heat transfer plate 170 is depicted. The heat transfer surface 176 is opposite the impingement surface 172. As stated above, the heat transfer surface 176 may be thermally coupled to one or more heat generating devices 190 at locations on the heat transfer plate 170 corresponding with the array of fins 174 (or the impingement block 173) of the impingement surface 172. The heat transfer surface 176 operates to transfer heat from the heat generating device 190 to the heat transfer plate 170, including the one or more arrays of fins 174. Heat transferred to the heat transfer plate 170 by the one or more heat generating devices 190 can be transferred to coolant fluid flowing through the modular jet impingement assembly 101. In one embodiment, the heat generating devices 190 are thermally coupled to the heat transfer surface 176 of the heat transfer plate 170 via an intermediate, thermally conductive substrate layer (not shown) (for example and without limitation, thermal paste, epoxy, direct bonded copper (DBC), direct bonded aluminum (DBA), or similar materials). The heat generating devices 190 may be bonded to the substrate layer by bonding techniques such as soldering, transient liquid phase bonding (TLP), or nano-silver sintering, for example. In some embodiments, the heat generating devices 190 are not bonded to the heat transfer surface 176 of a heat transfer plate 170 but rather just positioned adjacent thereto. As described in more detail below, each heat transfer plate 170 is cooled using jet impingement, providing cooling to the heat generating devices 190.

Heat generating devices 190 may include, but are not limited to, electronics devices such as semiconductor devices, insulated gate bipolar transistors (IGBT), metal-oxide-semiconductor field effect transistors (MOSFET), power diodes, power bipolar transistors, and power thyristor devices. As an example and not a limitation, the heat generating device 190 may be a component in an inverter and/or converter circuit used to electrically power high load devices, such as electric motors in electrified vehicles (e.g., hybrid vehicles, plug in hybrid electric vehicles, plug in electric vehicles, and the like).

Further, in each of the embodiments described herein, the heat transfer plate 170 may be coupled to the heat transfer plate receiving portion 132 of the distribution recess 130 through any appropriate connection to create a fluid-tight seal between the modular manifold 110 and the heat transfer plate 170 and form the impingement chamber therebetween. For example, one or more gaskets 131 (e.g., o-rings) may be positioned between the heat transfer plate receiving portion 132 of the distribution recess 130 and the impingement surface 172 of the heat transfer plate 170, for example, within the gasket recess 133 of the distribution recess 130. The one or more gaskets 131 may provide a fluid-tight seal (e.g., a face seal) between adjacent components of modular jet impingement assembly 101 such that coolant fluid introduced to the modular jet impingement assembly 101 may be maintained in a closed-loop cooling system as the coolant fluid circulates through the modular jet impingement assembly 101. The gaskets 131 may be made from a variety of materials that provide a fluid-tight seal between the generally non-compliant bodies of the modular jet impingement assembly 101. Examples of such materials include, without limitation, natural or synthetic elastomers, compliant polymers such as silicone, and the like. The one or more gaskets 131 may also be made from an assembly that includes compliant materials and non-compliant materials, such that the one or more gaskets 131 provide desired sealing characteristics while maintaining their geometric configuration. In other embodiments, for example, when the gaskets 131 are not utilized, such as embodiments where soldering, brazing, or ultrasonic welding is used to couple the modular manifolds 110 and the heat transfer plates 170.

Figure 6A:
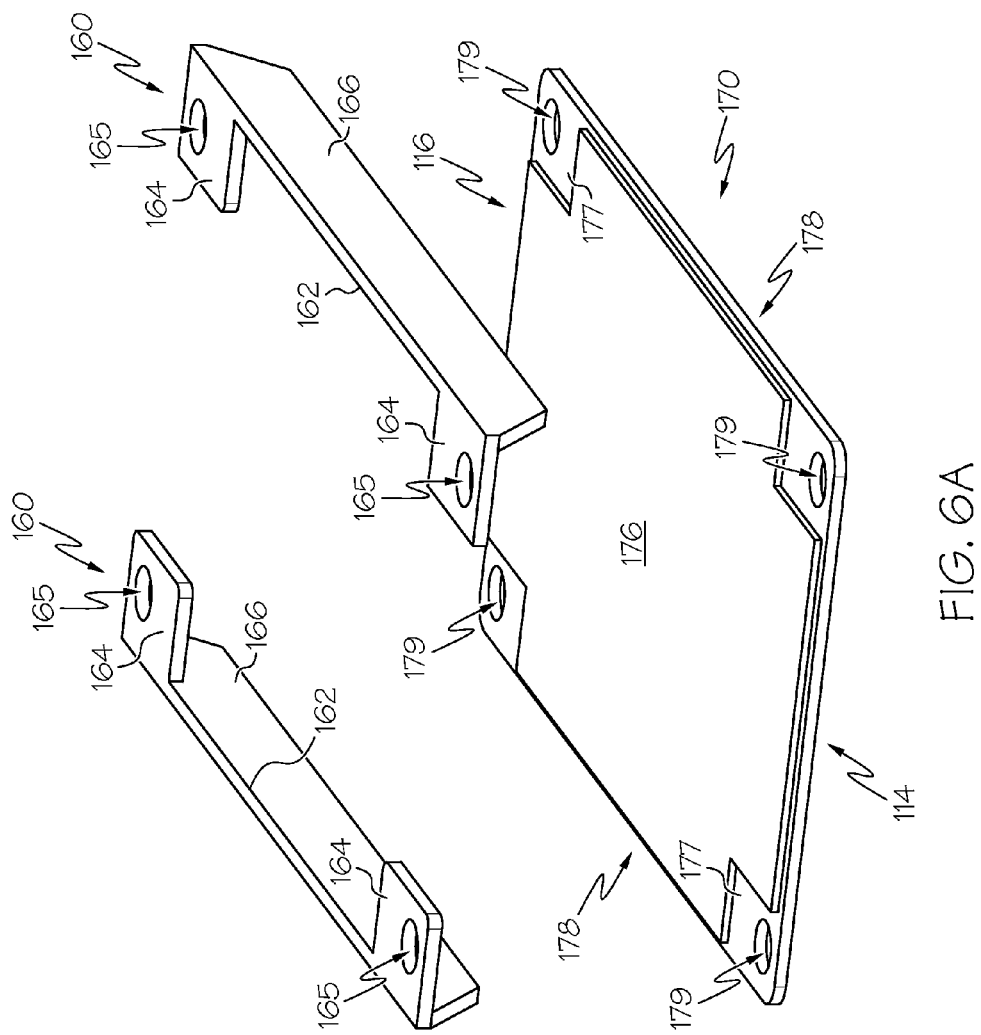
FIG. 6A schematically depicts an exploded view of a heat transfer plate and two brackets according to one or more embodiments shown or described herein.
Figure 6B:
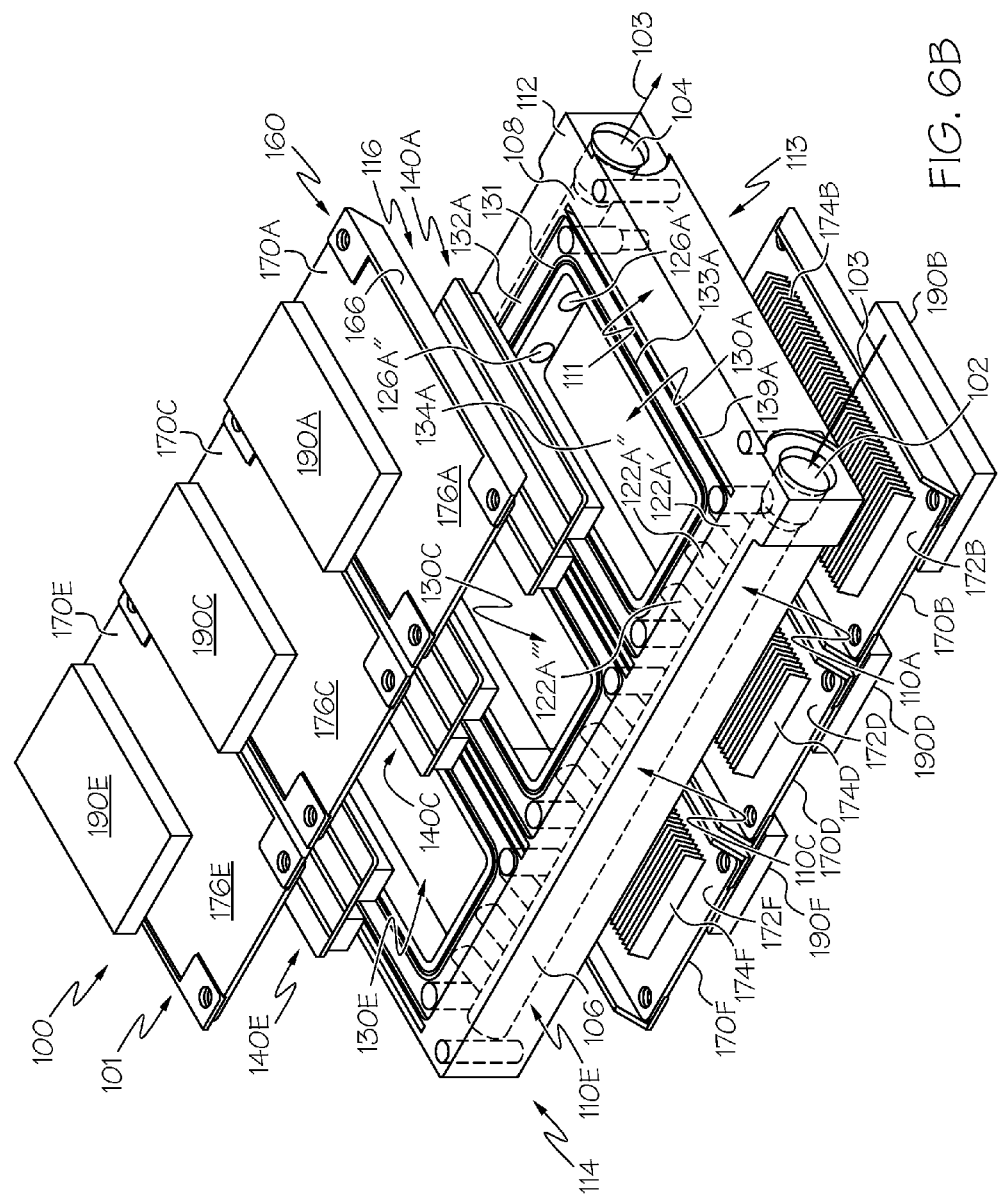
FIG. 6B schematically depicts an exploded isometric view of another example power electronics module having the brackets as shown in FIG. 6A, according to one or more embodiments shown or described herein.

Referring now to FIGS. 6A-6B, the modular jet impingement assembly 101 may include one or more brackets 160 that facilitate the mechanical connection between the modular manifold 110 and the heat transfer plate 170, for example, between the heat transfer plate 170 and the heat transfer plate receiving portion 132 of the distribution recess 130. When coupled to the heat transfer plate 170, the brackets 160 provide compression between the heat transfer plate 170 and the heat transfer plate receiving portion 132. For example, the compression provided by the brackets 160 may fluidly seal one or more gaskets 131 between the heat transfer plate 170 and the distribution recess 130.

As depicted in FIG. 6A, the bracket 160 extends along one or more lengths 178 of the heat transfer plate 170, providing a compressive force to the heat transfer plate 170 along the one more lengths 178. Further, the brackets 160 may have a heat transfer plate mating portion 162 configured to extend along the heat transfer surface 176 and, in some embodiments, configured to nest within a surface recess 177 of the heat transfer surface 176. One or more surface recesses 177 extend along the one or more lengths 178. In some embodiments, each surface recess 177 may extend into the heat transfer surface 176 between about 0.25 mm and 1 mm, such as about 0.5 mm. Further, the heat transfer plate mating portion 162 has a height (e.g., a direction substantially orthogonal the length 178 of the heat transfer plate 170) of between about 0.5 mm and 2.5 mm, such as 1.5 mm. In some embodiments, the heat transfer plate mating portion 162 further includes one or more coupling portions 164 each having a fastener hole 165 configured to align with a fastener hole 179 of the heat transfer plate 170, for receiving one or more fasteners.

In some embodiments, the brackets 160 include one or more extending portions 166 configured to extend beyond the heat transfer plates 170 into one or more manifold slots 139 of the modular manifold 110 (FIG. 6B). The extending portions 166 provide additional support for the mechanical connection between the heat transfer plates 170 and the modular manifolds 110, for example, along the lengths 178 of the heat transfer plate 170. By extending along the lengths 178 of the heat transfer plate 170, the brackets 160 stiffen the heat transfer plate 170 without increasing the thickness of the heat transfer plate 170 at locations where the heat generating devices 190 are thermally coupled to the heat transfer surface 176 of the heat transfer plate 170. In operation, the brackets 160 may facilitate fluid sealing at high pressure operations without increasing the thermal resistance of the heat transfer plate 170. Further, in some embodiments, the brackets 160 may be integrated into the heat transfer plates 170, for example, along the lengths 178 of the heat transfer plate 170. In these embodiments, portions of the heat transfer plate 170 extending along the lengths 178 of the heat transfer plates 170 are thicker than portions of the heat transfer plate 170 at locations where heat generating devices 190 may be thermally coupled. Additionally, it should be understood that the brackets 160 may be used in single sided modular jet impingement assemblies 101. For example, modular jet impingement assemblies 101 that include modular manifolds 110 with one or more distribution recesses 130 extending into one side of the modular manifolds 110.

Figure 7C:
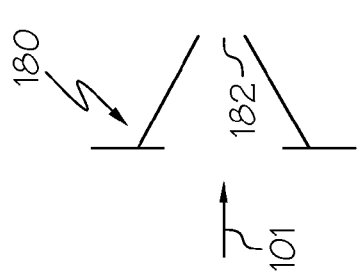
FIG. 7A schematically depicts an isometric view of a valve configured to be positioned within a modular jet impingement assembly according to one or more embodiments shown or described herein.
FIG. 7B schematically depicts the valve of FIG. 7A in a closed position according to one or more embodiments shown or described herein FIG. 7C schematically depicts the valve of FIG. 7A in an open position according to one or more embodiments shown or described herein FIG. 8 schematically depicts an exploded isometric view of an example power electronics module comprising a plurality of removably attachable modular manifolds according to one or more embodiments shown or described herein.
Figure 7B:
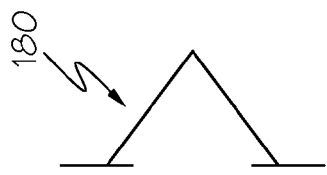
Figure 7A:
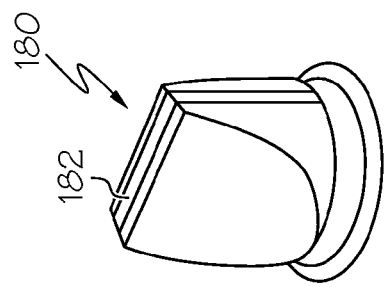

Referring now to FIG. 7A, a valve 180 comprising a valve inlet 182 is depicted. One or more valves 180 may be positioned within or adjacent the one or more inlet connection tubes 122'-122''', 124'-124''' to alter the cross sectional area of the one or more inlet connection tubes 122'-122''', 124'-124'''. By altering the cross sectional area of the inlet connection tubes 122'-122''', 124'-124''', the mass flow rate of coolant fluid entering the first and/or second distribution recess 130A-130F of each of the modular manifolds 110A-110C may be altered. Valves 180 comprising valve inlets 182 having a smaller cross sectional area allow less coolant fluid to enter the first and/or second distribution recess 130A-130F and valves 180 comprising valve inlets 182 having a larger cross sectional area allow more coolant fluid to enter the first and/or second distribution recess 130A-130F. Referring now to FIG. 7B, a schematic view of the valve 180 is depicted in a closed position, for example, when no coolant fluid is flowing through the valve 180. Referring now to FIG. 7C, a schematic view of the valve 180 is depicted in an open position. The valve 180 may be in the open position when coolant fluid is flowing through the valve 180.

In some embodiments, the valves 180 may comprise an electro active polymer having an adjustable rigidity and may be strengthened or weakened in response to a received electronic signal. For example, a positive potential and/or a negative potential may be applied to the electro-active polymer. The adjustable rigidity of the one or more valves 180 may alter the flow resistance of the one or more valves 180. When an individual valve 180 with electro active polymer is strengthened, less coolant fluid is able to flow through the valve inlet 182 and when the valve with electro active polymer is weakened, more coolant fluid is able to flow through the valve inlet 182.

Some embodiments of the modular jet impingement assembly 101 may further comprise a feedback loop controller communicatively coupled to the modular jet impingement assembly 101, for example, communicatively coupled to one or more valves 180 positioned within the modular jet impingement assembly 101. In some embodiments, the feedback loop controller comprises a proportional-integral-derivative (PID) feedback loop controller. Additionally, the feedback loop controller may be communicatively coupled with one or more temperature sensors and one or more pressure sensors configured to monitor the temperature and pressure of one or more components of the modular jet impingement assembly 101 and one or more heat generating devices 190 thermally coupled to the modular jet impingement assembly 101. The feedback loop controller may provide a signal to the one or more valves 180 to adjust the rigidity of the one or more valves 180 to actively control the mass flow rate of the coolant fluid in response to received temperature and or pressure signals. For example, the feedback loop controller may weaken the rigidity of one or more valves 180 to provide more coolant fluid to an individual modular manifold 110 in response to a high measured temperature of the individual modular manifold 110.

Referring again to FIGS. 1-3, operation of the modular jet impingement assembly 101 will now be described. Coolant fluid flows through the inlet tube 106 such that a portion of coolant fluid enters each modular manifold 110A-110C in a parallel flow pattern (e.g., enters the first and second distribution recesses 130A/130B, 130C/130D, 130E, 130F of each modular manifold 110A-110C in a parallel flow pattern). In other embodiments, as described below (e.g., FIG. 11), the coolant fluid may enter each modular manifold 110A-110C iteratively in a series flow pattern (e.g., enters the first and second distribution recesses 130A, 130B of the first modular manifold 110A, then enters the first and second distribution recesses 130C, 130D of the second modular manifold 110B, then enters the first and second distribution recesses 130E, 130F of the third modular manifold 110C, in a series flow pattern). The volume of coolant fluid that enters each modular manifold 110A-110C may be passively controlled as described above, for example, by altering the inlet geometry (e.g., diameter) of the inlet connection tubes 122'-122''', 124'-124''', positioning one or more valves 180 (FIGS. 7A-7C) within the fluid flow path 103, and/or positioning one or more porous media portions within the fluid flow path 103. The volume of coolant fluid that enters each modular manifold 110A-110C may also be actively controlled using a feedback loop controller communicatively coupled to the one or more valves 180. Further, the fluid inlet 102 and the fluid outlet 104 may be coupled to a fluid reservoir (not shown) that houses coolant fluid. The fluid reservoir can provide coolant fluid to the modular jet impingement assembly 101 through the fluid inlet 102 and cool heated coolant fluid when it returns to the fluid reservoir through the fluid outlet 104, preparing the coolant fluid for reuse.

More specifically, referring to the first modular manifold 110A depicted in FIGS. 1-3 for ease of understanding, coolant fluid enters the modular jet impingement assembly 101 through the fluid inlet 102 and traverses the inlet tube 106. A portion of the coolant fluid enters the first distribution recess 130A of the first modular manifold 110A through each of the first group of inlet connection tubes 122A'-122A''' fluidly coupled to the first distribution recess 130A and another portion of the coolant fluid enters the second distribution recess 130B of the first modular manifold 110A through each of the second group of inlet connection tubes 124A'-124A'''. When the first manifold insert 140A is positioned with the first distribution recess 130A, the portion of the coolant fluid introduced into the first distribution recess 130A enters the inlet branch channels 142 of the first manifold insert 140A and passes through the impinging slots 152, forming a jet of coolant fluid that is ejected through the first manifold insert 140A toward the impingement surface 172A of the first heat transfer plate 170A. Additionally, when the portion of the coolant fluid introduced into the second distribution recess 130B enters the inlet branch channels 142 of the second manifold insert 140B and passes through the impinging slots 152, a jet of coolant fluid is ejected through the second manifold insert 140B toward the impingement surface 172B of the second heat transfer plate 170B.

Referring collectively to both the first and second heat transfer plates 170A, 170B, in embodiments in which the impingement surface 172 has the array of fins 174, the jet of coolant fluid impinges the array of fins 174 (FIGS. 5A and 5B) and transfers heat from the array of fins 174 to the coolant fluid. Alternatively, in embodiments in which the impingement surface 172 has an impingement block 173, the jet of coolant fluid impinges the impingement block 173, however, because the impingement block 173 comprises a non-thermally conductive material, minimal heat is transferred from the impingement block 173 to the coolant fluid.

In some embodiments, an individual heat transfer plate 170 comprising an impingement surface 172 that has the impingement block 173 may be coupled to the first side 111 or the second side 113 of the modular manifold 110 when cooling is not desired at a particular location of the modular jet impingement assembly 101. For example, in some applications, it may be desired to couple heat generating devices 190 to some but not all locations of the modular jet impingement assembly 101. For example, it may be desired to couple the heat generating devices 190 to the heat transfer plates 170 coupled to the first side 111 of each modular manifold 110 but not couple the heat generating devices 190 to the heat transfer plates 170 coupled to the second side 113 of each modular manifold 110. In this embodiment, the heat transfer plates 170 coupled to the first side 111 of each modular manifold 110 and thermally coupled to the heat generating device 190 may have the array of fins 174 positioned on the impingement surface 172 and the heat transfer plates 170 coupled to the second side 113 of each modular manifold 110 (e.g., the heat transfer plates 170 not thermally coupled to the heat generating device 190) may have the impingement block 173 positioned on the impingement surface 172.

Referring still to the operation of the modular jet impingement assembly 101, after impinging the one or more arrays of fins 174 and/or the one of more impingement blocks 173 of the heat transfer plate 170, the coolant fluid (heated if impinging a heat transfer plate 170 with a heat generating device 190 thermally coupled thereto) flows away from the one or more arrays of fins 174 and/or the one or more impingement blocks 173 within the impingement chamber and reenters the manifold insert 140 through the collecting slot 154, for example, through an adjacent collecting slot 154 and into an outlet branch channel 144. Additionally, the outlet connection tubes 126A', 126A'' and 128A', 128B'' are positioned downstream from the first and second distribution recesses 130A, 130B, respectively, and fluidly couple the outlet branch channels 144 of each manifold insert 140A, 140B and the first and second distribution recesses 130A, 130B with the outlet tube 108 of the modular jet impingement assembly 101. The coolant fluid then flows through the fluid outlet 104 and travels to the fluid reservoir where the coolant fluid is prepared for reuse.

Figure 8:
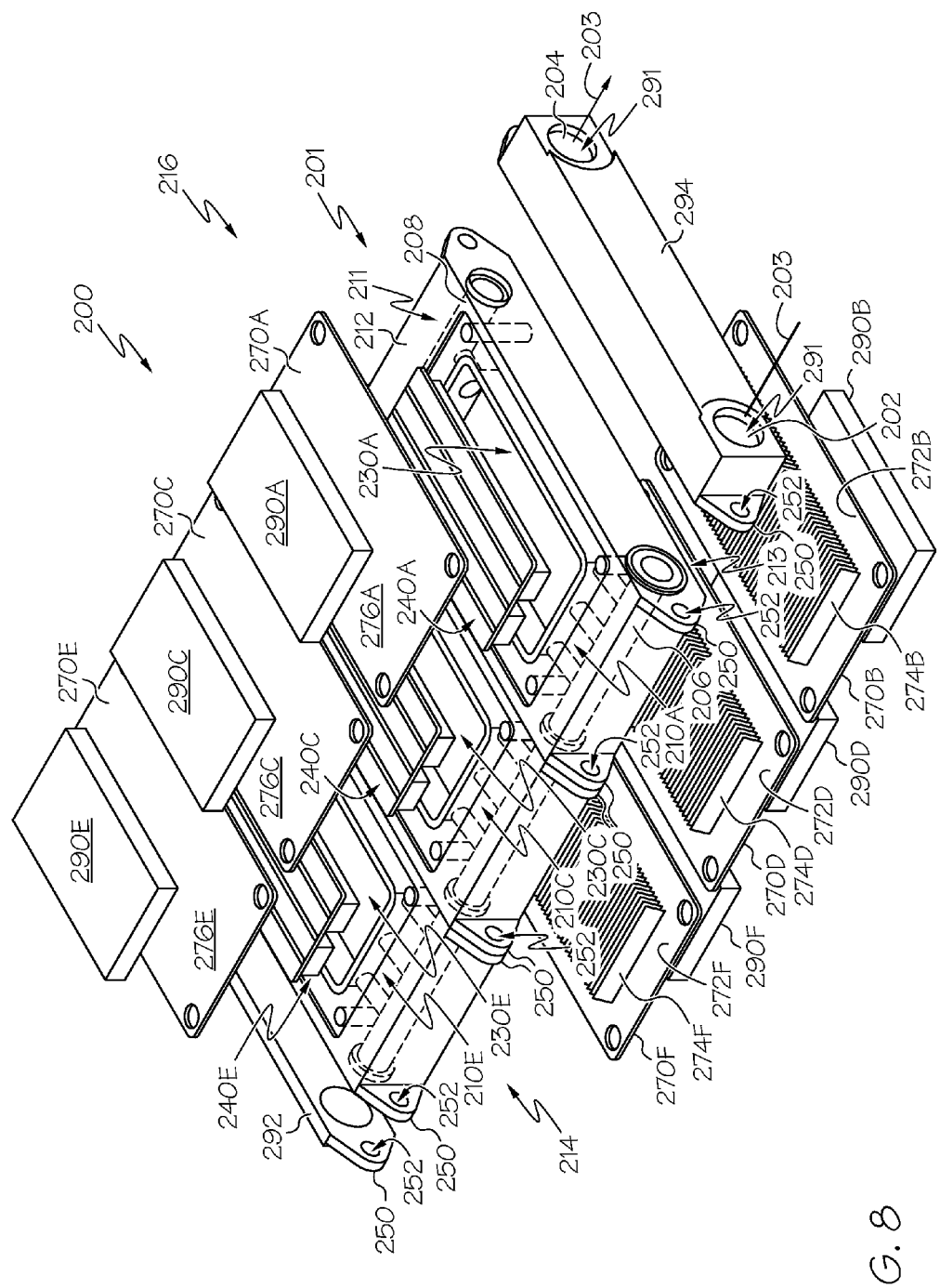

Referring now to FIG. 8, a power electronics module 200 including a modular jet impingement assembly 201 is depicted comprising a plurality of removably coupled modular manifolds 210. In this embodiment, three removably coupled modular manifolds 210A-210C are depicted, however, it should be understood that any number of modular manifolds 210 are contemplated. The modular manifolds 210A-210C may comprise the same components as the modular manifolds 110A-110C described above. Further, one or more manifold inserts 240A-240F may be positioned within the first and second distribution recesses 230A-230F of each of the modular manifolds 210A-210C and one or more heat transfer plates 270A-270F may be coupled to the modular manifolds 210A-210C, as described above. Further, the one or more heat transfer plates 270A-270F may be thermally coupled to one or more heat generating devices 290A-290F and may include an array of fins 274 positioned on the impingement surface 272 of the one or more heat transfer plates 270A-270F. Alternatively, some heat transfer plates 270 of the one or more heat transfer plates 270A-270F may not be thermally coupled to an individual heat generating device 290 and may include an impingement block 273 positioned on the impingement surface 272 of the heat transfer plates 270 not thermally coupled to the individual heat generating device 290.

Figure 9:
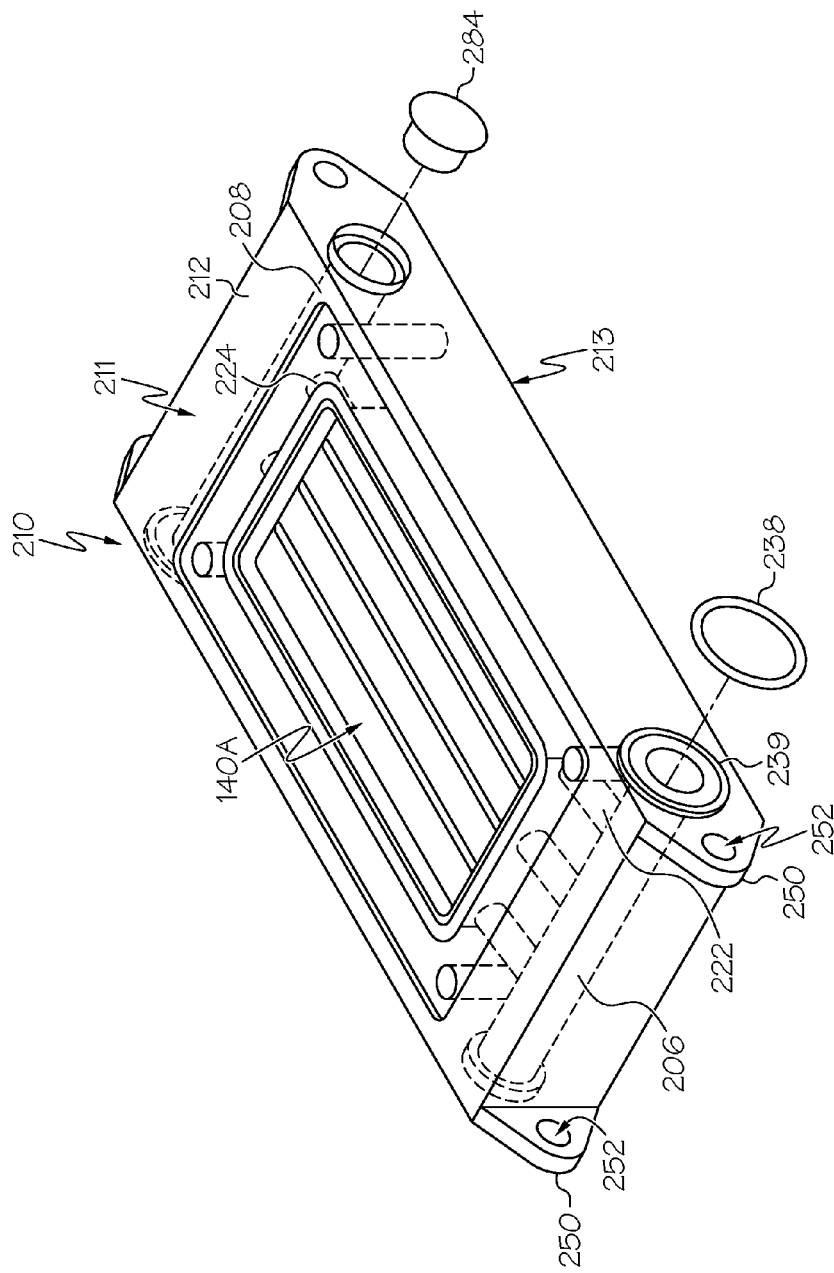
FIG. 9 schematically depicts an isometric view of an example embodiment of an individual removably attachable modular manifold of FIG. 8 according to one or more embodiments shown or described herein.
Figure 15A:
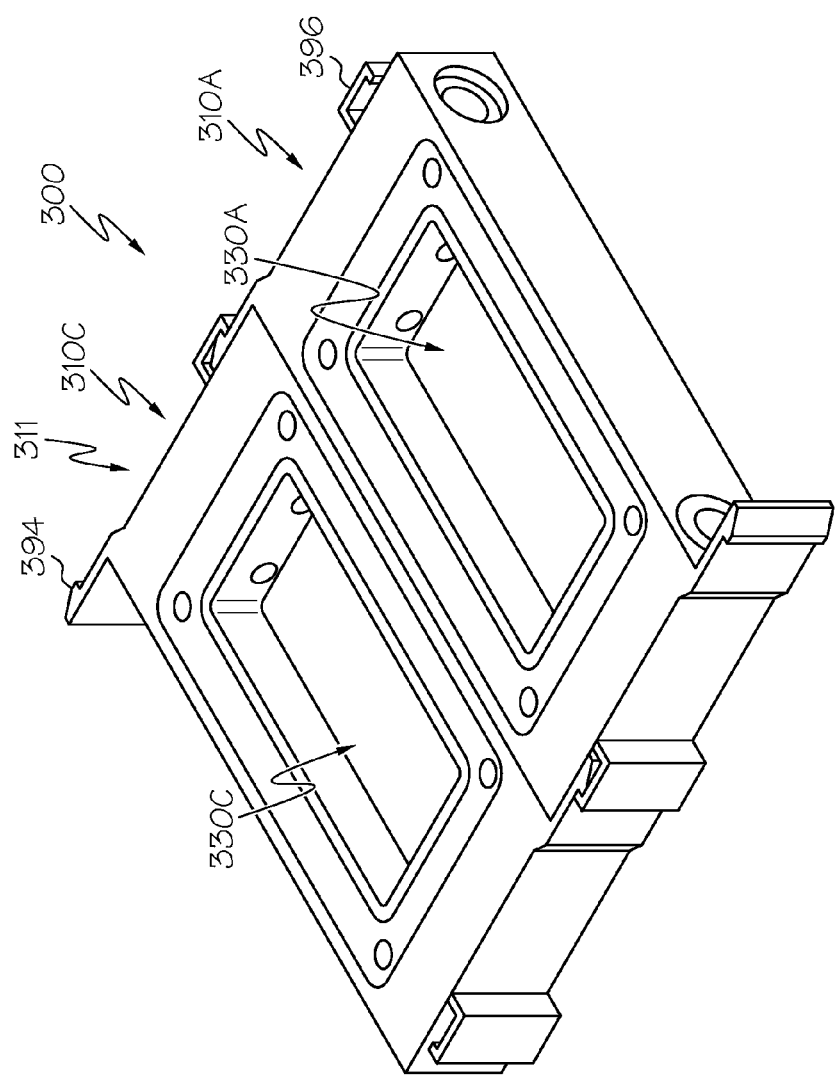
FIG. 15A schematically depicts an isometric view of a first side of an example modular jet impingement assembly comprising a plurality of removably attachable modular manifolds coupled in a snap fit arrangement according to one or more embodiments shown or described herein.
Figure 15B:
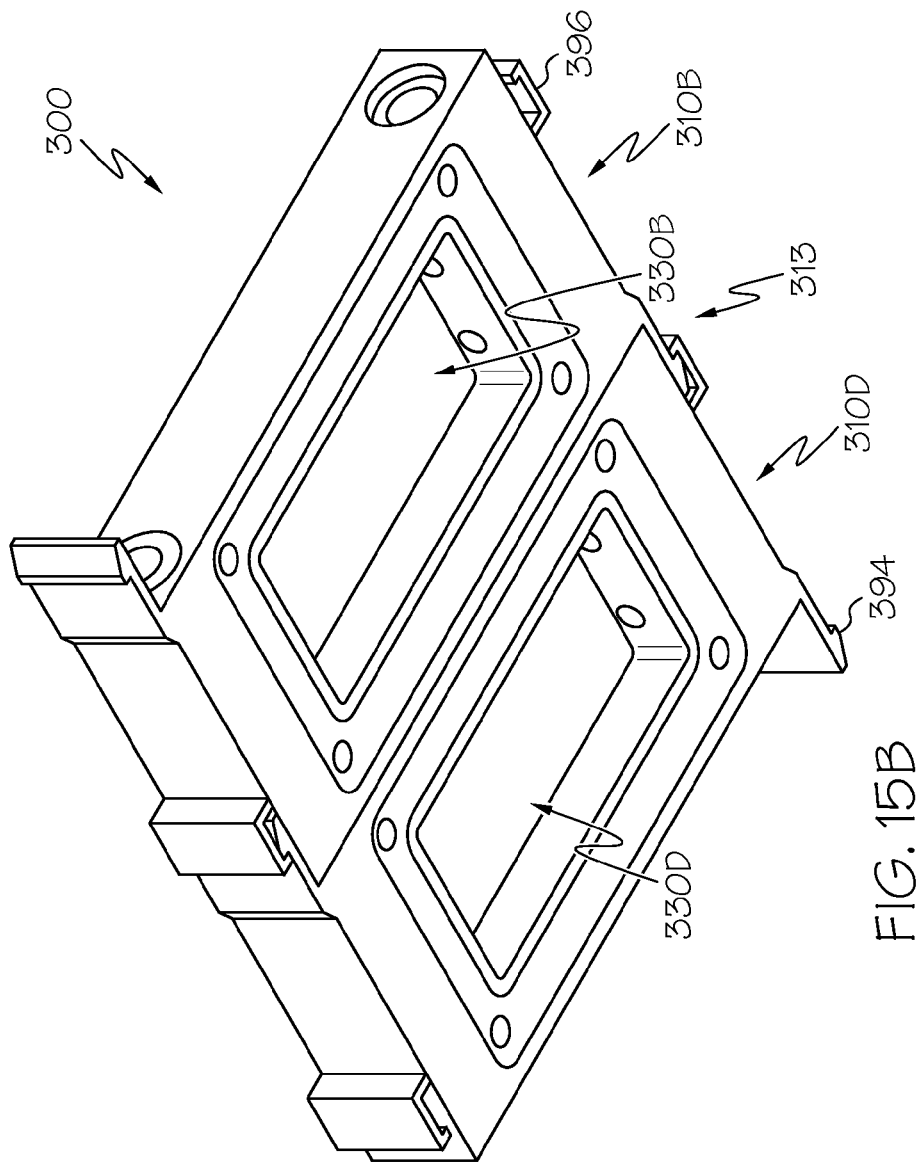
FIG. 15B schematically depicts an isometric view of a second side of the modular jet impingement assembly of FIG. 15A according to one or more embodiments shown or described herein.

The modular jet impingement assembly 201 further comprises an inlet tube 206 having a plurality of discrete portions traversing each modular manifold 210 and an outlet tube 208 having a plurality of discrete portions traversing each modular manifold 210. When the one or more modular manifolds 210 are coupled together, the inlet tubes 206 and the outlet tubes 208 may be fluidly coupled to form a continuous fluid flow path 203. The individual modular manifolds 210 may be coupled using a fastener engagement, for example, a flange and bolt arrangement as depicted in FIGS. 8 and 9, or a snap fit engagement, as depicted in FIGS. 15A and 15B. In embodiments with the flange and bolt arrangement depicted in FIGS. 8 and 9, each individual modular manifold 210 may have one or more flanges 250 that each include a flange hole 252 disposed through the flange 250. In embodiments in which multiple modular manifolds 210 are coupled together, flanges 250 of adjacent modular manifolds 210 may be aligned. To couple the adjacent modular manifolds 210, a bolt can be disposed through the flange holes 252 of the flanges 250 of adjacent modular manifolds 210.

Referring now to FIG. 9, in these embodiments, an o-ring 238 may be positioned between adjacent inlet tubes 206 and adjacent outlet tubes 208. The o-ring 238 may be positioned within an o-ring groove 239 of each modular manifold 210 circumscribing the inlet tube 206 and/or the outlet tube 208, providing a fluid-tight seal between adjacent modular manifolds 210. Additionally, as depicted in FIG. 8, the modular jet impingement assembly 201 may have one or more fitting caps 294 and may have an end cap 292. The one or more fitting caps 294 may be coupled to one or more modular manifolds 210, for example, as depicted in FIG. 8, the first modular manifold 210A. Further, the one or more fitting caps 294 and the one or more end caps 292 may include flanges 250 and flange holes 252 which may be aligned with the flanges 250 and flange holes 252 of adjacent modular manifolds 210 allowing one or more fitting caps 294, one or more end caps 292, or a combination of both, to be coupled to one or more modular manifolds 210. The one or more fitting caps 294 also comprise one or more throughputs 291 which may be used as the fluid inlet 202 and/or the fluid outlet 204. The end cap 292 may be coupled to one of the modular manifolds 210, for example, as depicted in FIG. 8, coupled to the third modular manifold 210C and may fluidly seal one side of the modular manifold 210.

Referring to FIGS. 8 and 9, one or more plugs 284 may be removably positioned within the inlet tubes 206, the outlet tubes 208, and/or the throughputs 291 of the fitting caps 294 to fluidly block a portion of the inlet tube 206, the outlet tube 208 and/or the throughputs 291 of the fitting caps 294 to alter the fluid flow path 203. As described below, the plugs 284 may be positioned within the modular jet impingement assembly 201 to provide a customized fluid flow path 203. For example, as depicted in FIG. 9, one or more plugs 284 may be positioned between discrete portions of the inlet tubes 206 and/or the outlet tubes 208 to control the fluid flow path 203 of the coolant fluid through the modular jet impingement assembly 101. The plugs 284 may comprise a plastic, polymer, metal, or the like.

Referring now to FIGS. 10-14, in embodiments in which the modular manifolds 210 are removably coupled, the fluid flow path 203 may be altered by positioning one or more plugs 284 between adjacent discrete portions of the inlet tube 206 and/or the outlet tube 208. For example, the fluid flow path 203 may be positioned in a series flow pattern, a parallel flow pattern, or a combination thereof. Additionally, the positioning of the fitting cap 294 and the end cap 292 may alter the fluid flow path 203.

Figure 10:
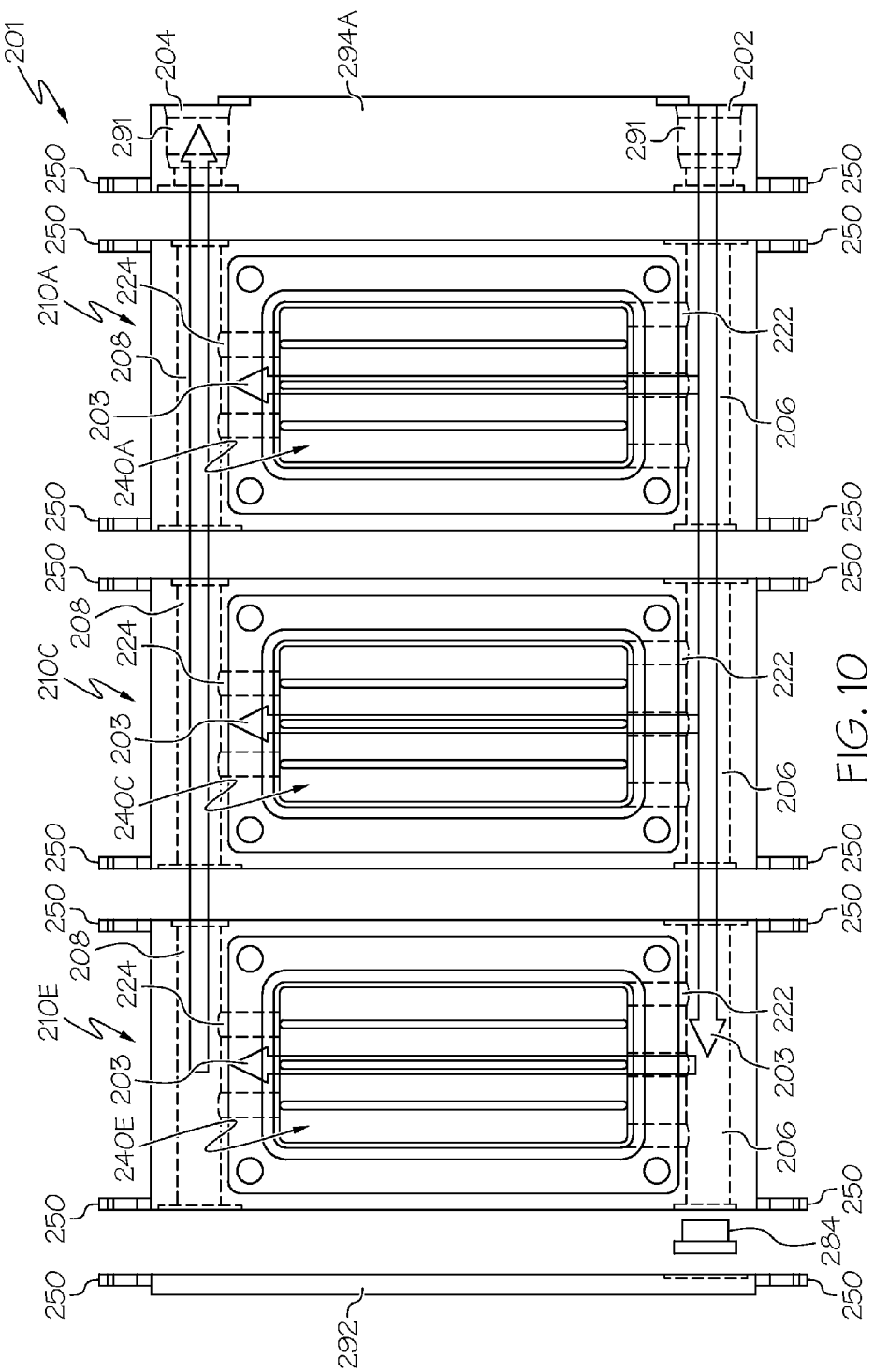
FIG. 10 schematically depicts a top view of the modular jet impingement assembly of FIG. 8 having a fluid inlet and a fluid outlet disposed through the same fitting cap and comprising a plurality of removably attachable modular manifolds arranged in parallel according to one or more embodiments shown or described herein.

Referring now to FIG. 10, an embodiment of the modular jet impingement assembly 201 is depicted comprising three removably coupled modular manifolds 210A-210C. In this embodiment, the fluid inlet 202 and the fluid outlet 204 are each positioned within the fitting cap 294A removably coupled to the first modular manifold 210A and an end cap 292 is positioned opposite the fitting cap 294A and is removably coupled to the third modular manifold 210C. Further, a plug 284 is positioned between the end cap 292 and the inlet tube 206 and in alignment with the fluid inlet 202 such that the fluid flow path 203 is configured in a parallel flow pattern. In the parallel flow pattern, a portion of the coolant fluid flows through each of the modular manifolds 210A-210C.

Figure 11:
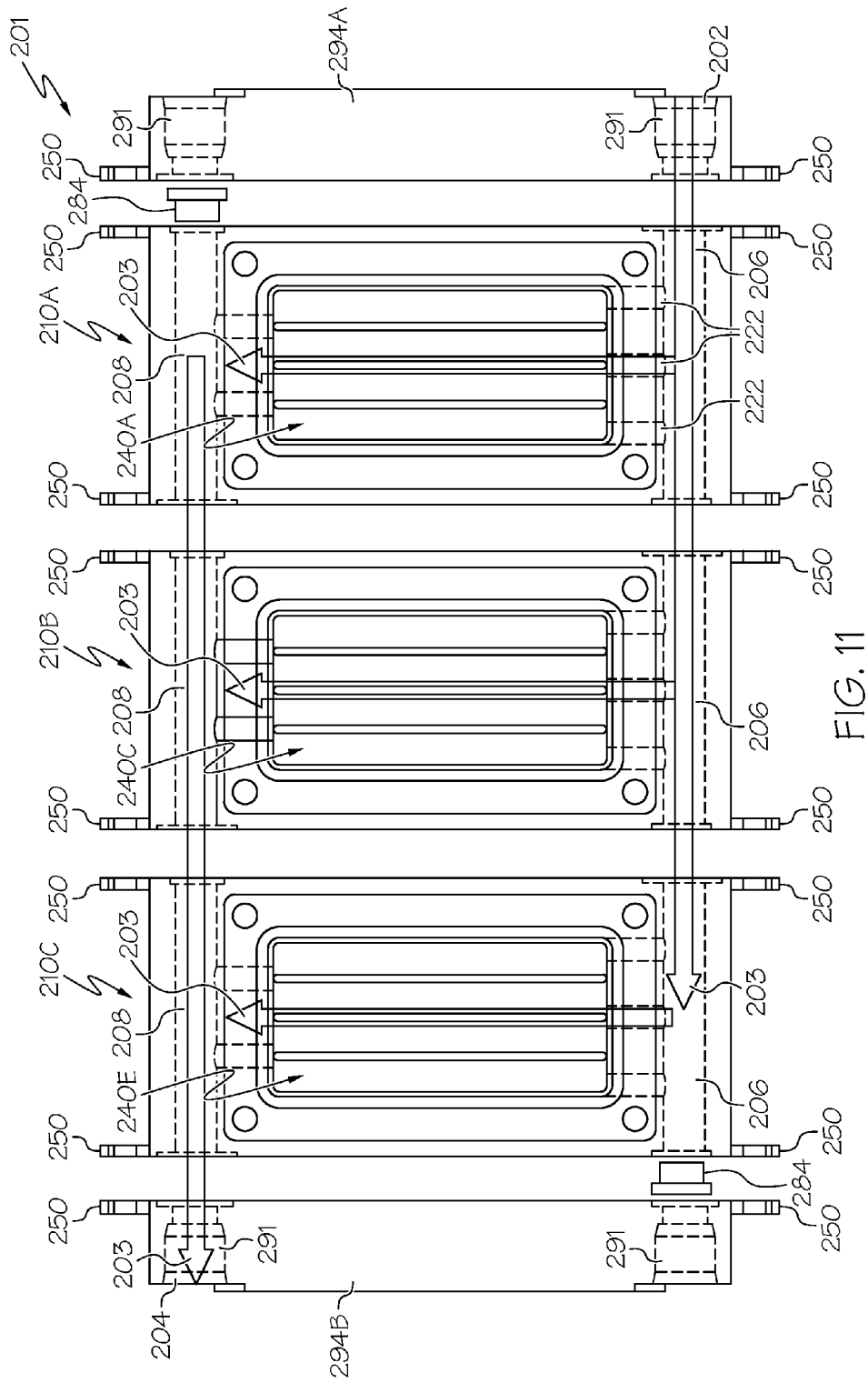
FIG. 11 schematically depicts a top view of the modular jet impingement assembly of FIG. 8 having a fluid inlet and a fluid outlet disposed through different fitting caps and comprising a plurality of removably attachable modular manifolds arranged in parallel according to one or more embodiments shown or described herein.

Referring now to FIG. 11, another embodiment of the modular jet impingement assembly 201 is depicted comprising three modular manifolds 210A-210C assembled such that the fluid inlet 202 is positioned within the fitting cap 294 coupled to the first modular manifold 210A and the fluid outlet 204 is positioned within the fitting cap 294 coupled to the third modular manifold 210C. Further, plugs 284 are positioned within unused throughputs 291 of each fitting caps 294 (i.e. the throughputs 291 that are not being used as the fluid inlet 202 or the fluid outlet 204) such that the fluid flow path 203 is configured in a parallel flow pattern and a portion of the coolant fluid flows through each of the modular manifolds 210A-210C.

Figure 12:
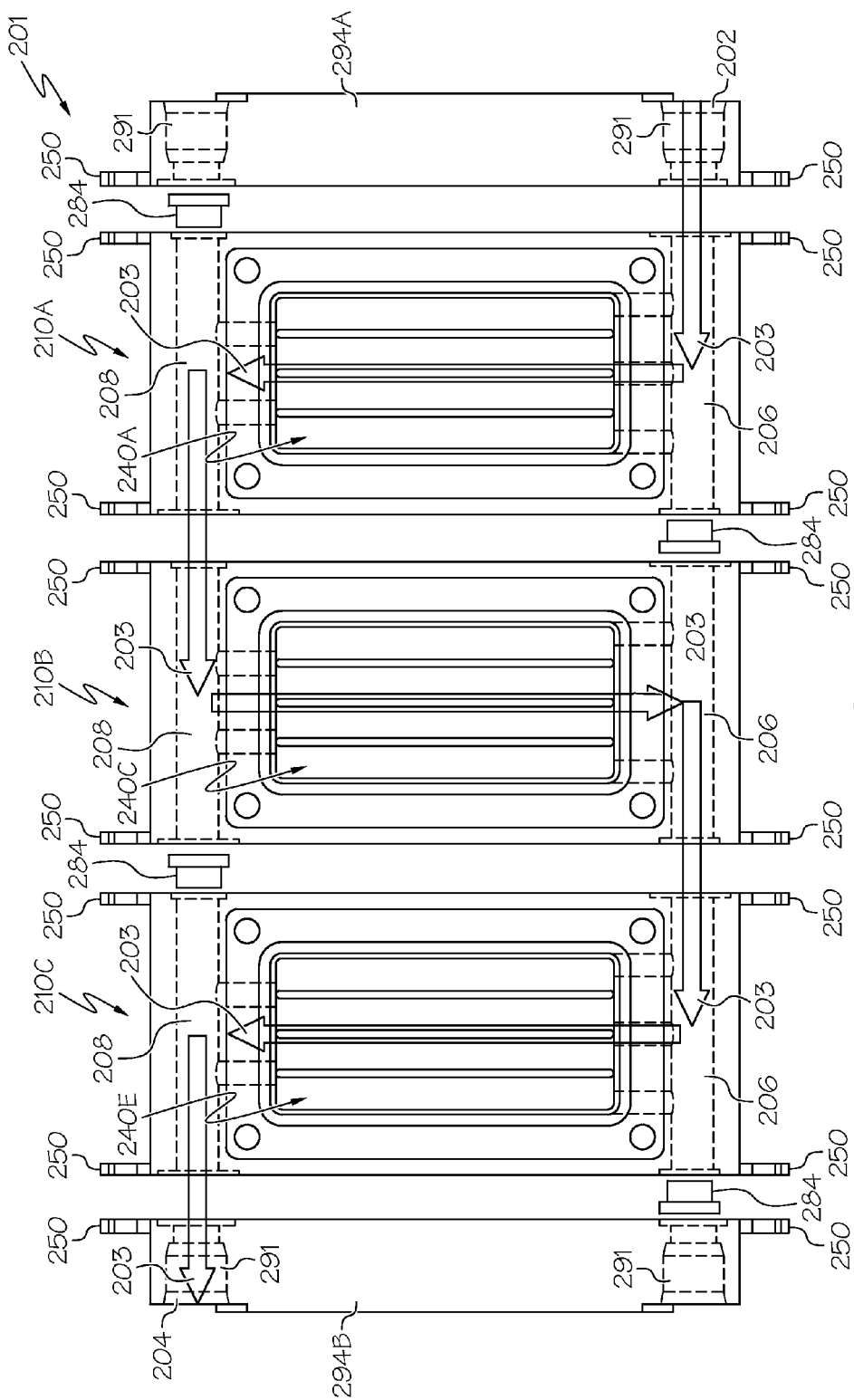
FIG. 12 schematically depicts a top view of the modular jet impingement assembly of FIG. 8 comprising a plurality of removably attachable modular manifolds arranged in series according to one or more embodiments shown or described herein.

Referring now to FIG. 12, another embodiment of the modular jet impingement assembly 201 is depicted comprising three modular manifolds 210A-210C assembled such that the fluid inlet 202 is positioned within the fitting cap 294 coupled to the first modular manifold 210A and the fluid outlet 204 is positioned within the fitting cap 294 coupled to the third modular manifold 210C. Plugs 284 are positioned within unused throughputs 291 of each fitting cap 294 (i.e. the throughputs 291 that are not being used as the fluid inlet 202 or the fluid outlet 204). Additionally, a plug 284 is positioned between the discrete portions of the inlet tube 206 that extend through the first modular manifold 210A and the second modular manifold 210B and another plug 284 is positioned between the discrete portions of the outlet tube 208 that extend through the second modular manifold 210B and the third modular manifold 210C. In this arrangement, the fluid flow path 203 is configured in a series flow pattern. In the series flow pattern, all coolant fluid that enters the fluid inlet 202 flows through each of the modular manifolds 210A-210C iteratively. For example, in operation, the coolant fluid first traverses the first modular manifold 210A, portions of the coolant fluid impinging the impingement surface 272 of the first and second heat transfer plates 270A, 270B, next the coolant fluid traverses the second modular manifold 210B, portions of the coolant fluid impinging the impingement surface 272 of the third and fourth heat transfer plates 270C, 270D, next the coolant fluid traverses the third modular manifold 210C, portions of the coolant fluid impinging the impingement surface 272 of the fifth and sixth heat transfer plates 270E, 270F, and finally the coolant fluid exits through the fluid outlet 204.

Figure 13:
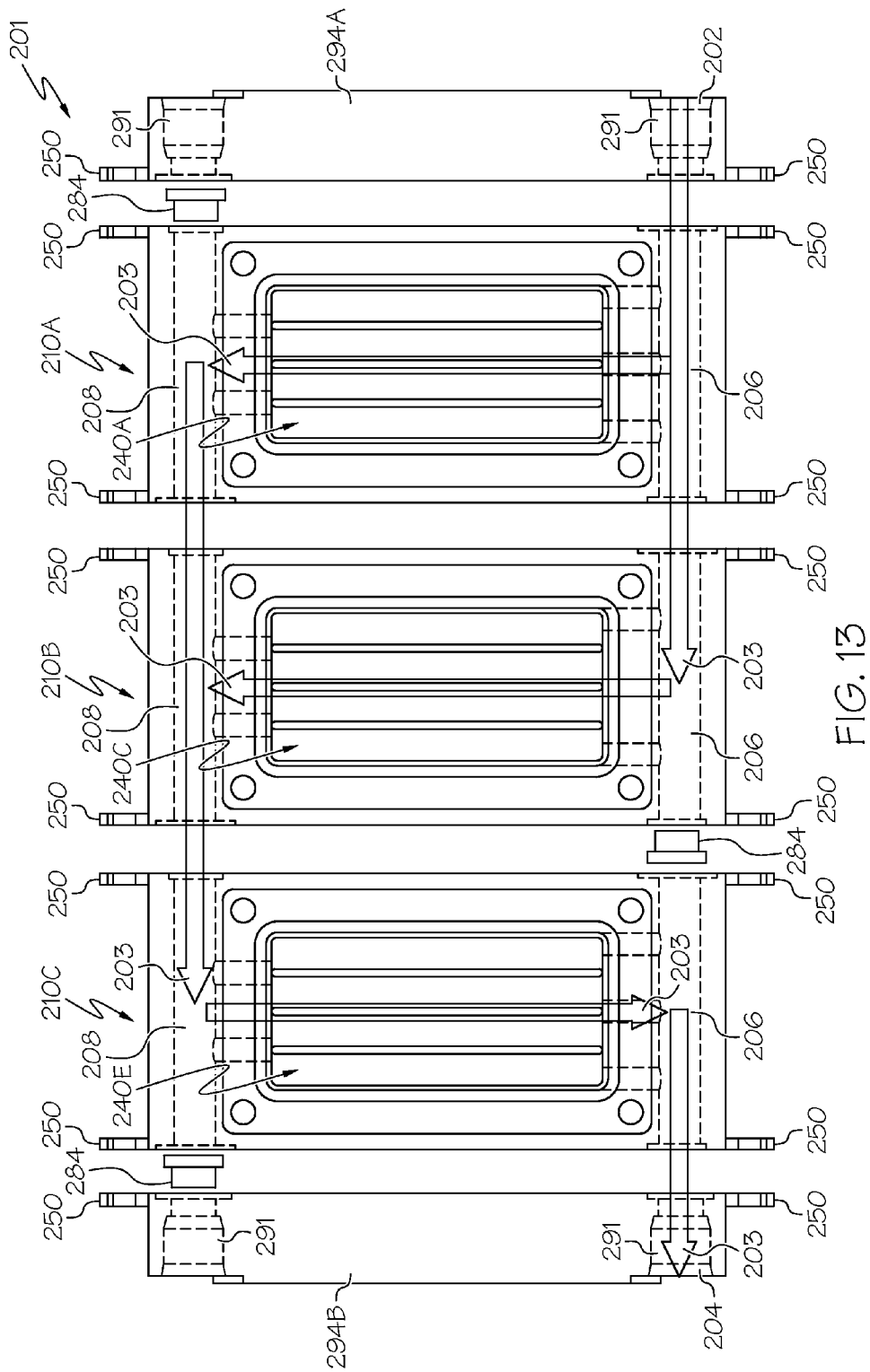
FIG. 13 schematically depicts a top view of the modular jet impingement assembly of FIG. 8 comprising a plurality of removably attachable modular manifolds arranged partially in series and partially in parallel according to one or more embodiments shown or described herein.

Referring now to FIG. 13, an embodiment of the modular jet impingement assembly 201 is depicted comprising three modular manifolds 210A-210C assembled such that the fluid flow path 203 comprises a partial series and a partial parallel flow pattern. In this embodiment, the fluid inlet 202 is positioned within the fitting cap 294 coupled to the first modular manifold 210A and the fluid outlet 204 is positioned within the fitting cap 294 coupled to the third modular manifold 210C. The fluid inlet 202 and the fluid outlet 204 are each aligned with the inlet tube 206. Plugs 284 are positioned within unused throughputs 291 of each fitting caps 294 (i.e. the throughputs 291 that are not being used as the fluid inlet 202 or the fluid outlet 204). Additionally, a plug 284 is positioned between discrete portions of the inlet tube 206 that extend through the second modular manifold 210B and the third modular manifold 210C. In this embodiment, the fluid flow path 203 traverses the first modular manifold 210A and the second modular manifold 210B in a parallel flow pattern and traverses the third modular manifold 210C is in a series flow pattern. In this embodiment, in operation, a first portion of the coolant fluid traverses the first modular manifold 210A and a second portion of the coolant fluid traverses the second modular manifold 210B substantially simultaneously. Next, all the first and second portion of the coolant fluid rejoin before traversing the third modular manifold 210C and exiting the fluid outlet 204.

Figure 14:
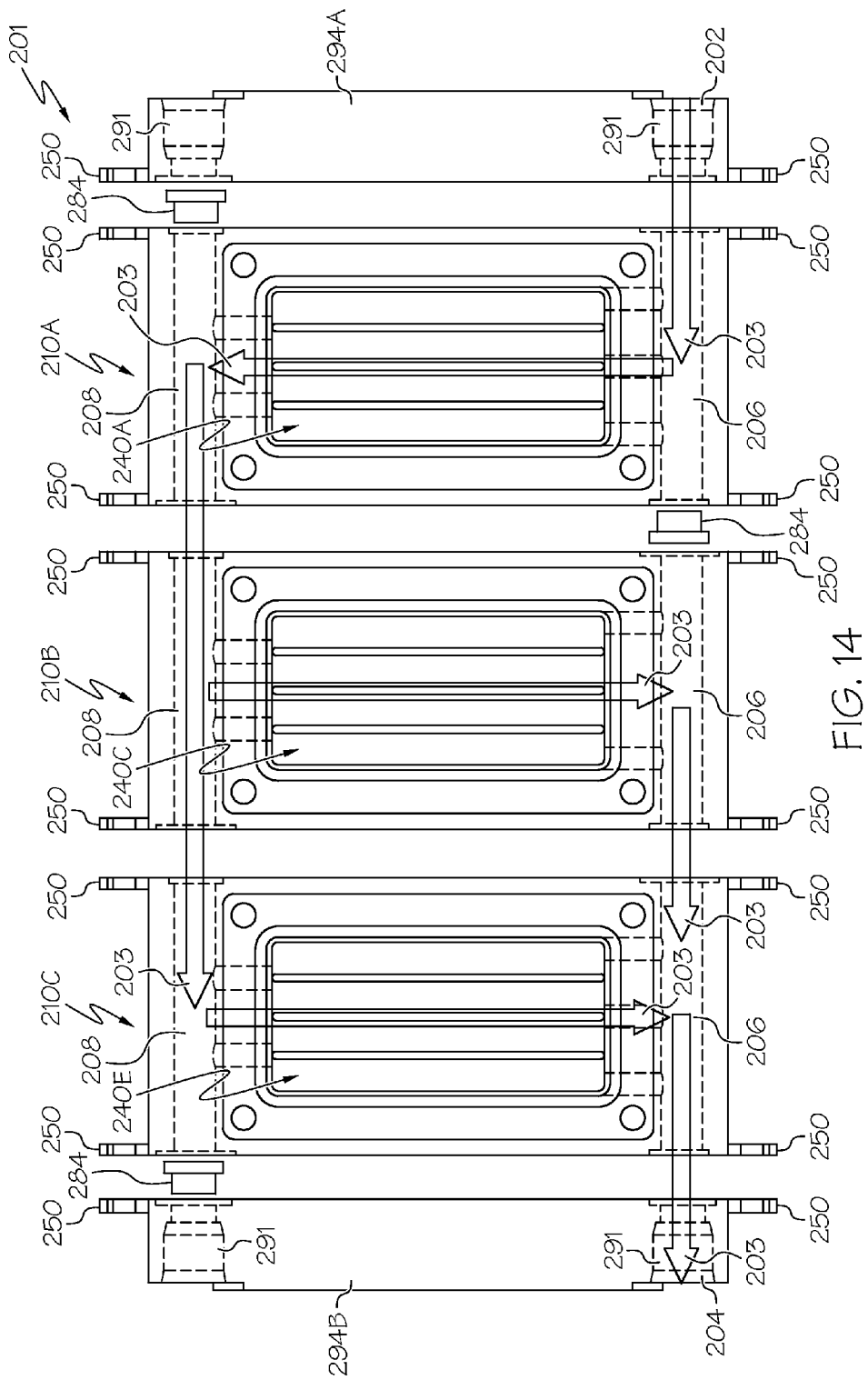
FIG. 14 schematically depicts a top view of the modular jet impingement assembly of FIG. 8 comprising a plurality of removably attachable modular manifolds arranged partially in series and partially in parallel according to one or more embodiments shown or described herein.

Referring now to FIG. 14, an embodiment of the modular jet impingement assembly 201 is depicted comprising three modular manifolds 210A-210C assembled such that the fluid flow path 203 comprises a partial series and a partial parallel flow pattern. In this embodiment, the fluid inlet 202 is positioned within the fitting cap 294 coupled to the first modular manifold 210A and the fluid outlet 204 is positioned within the fitting cap 294 coupled to the third modular manifold 210C. The fluid inlet 202 and the fluid outlet 204 are each aligned with the outlet tube 208. Plugs 284 are positioned within unused throughputs 291 of each fitting caps 294 (i.e. the throughputs 291 that are not being used as the fluid inlet 202 or the fluid outlet 204). Additionally, a plug 284 is positioned between discrete portions of the inlet tube 206 that extend through the first modular manifold 210A and the second modular manifold 210B. In this embodiment, the fluid flow path 203 traverses the first modular manifold 210A is a series flow pattern and traverses the second modular manifold 210B and the third modular manifold 210C is in a parallel flow pattern. In this embodiment, in operation, the coolant fluid first traverses the first modular manifold 210A then a first portion of the coolant fluid traverses the second modular manifold 210B and a second portion of the coolant fluid traverses the third modular manifold 210C substantially simultaneously. Next, all the first and second portion of the coolant fluid rejoin and exit the fluid outlet 204.

Referring now to FIGS. 15A and 15B, another embodiment of a modular jet impingement assembly 300 is depicted comprising a plurality of removably coupled modular manifolds 310 comprising a snap fit coupling configuration. In this embodiment, each modular manifold 310, (e.g., a first modular manifold 310A and a second modular manifold 310B) comprise one or more tab portions 394 and one or more hook portions 396 configured to connect in a snap-fit arrangement to create a fluid seal between the first modular manifold 310A and the second modular manifold 310B. Further, as depicted in FIG. 15A, each modular manifold comprises a first distribution recess 330A, 330C extending into a first side 311 of the first and second modular manifolds 310A, 310B, respectively, (FIG. 15A) and comprises a second distribution recess 330B, 330D extending into a second side 313 of the first and second modular manifolds 310A, 310B, respectively (FIG. 15B).

It should now be understood that modular jet impingement assemblies and power electronics modules incorporating modular jet impingement assemblies allow for configurable, double-sided jet impingement to facilitate efficient and targeted transfer of heat away from heat generating devices, which may increase the life of the heat generating device. The modular jet impingement assemblies comprise an inlet tube fluidly coupled to an fluid inlet, an outlet tube fluidly coupled to a fluid outlet, one or more modular manifolds, two or more manifold inserts removably positioned within two sides of the one or more modular manifolds, and two or more heat transfer plates coupled to modular manifolds and positioned proximate the two or more manifold inserts. The modular manifolds are configured to provide jet impingement cooling to the one or more heat transfer plates. Coolant fluid flow through the modular jet impingement assemblies may be passively controlled by altering the geometry of a fluid flow path and actively controlled by positioning one or more electronically adjustable valves within the fluid flow path. Additionally, heat transfer plates may selectively include an array of fins or an impingement block. For example, impingement blocks may be positioned on heat transfer plates that do not receive a heat generating device, such as when there are more heat transfer plates than heat generating devices.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:

1. A modular jet impingement assembly comprising:
   an inlet tube fluidly coupled to a fluid inlet;
   an outlet tube fluidly coupled to a fluid outlet;
   a modular manifold comprising:
      a first distribution recess extending into a first surface of the modular manifold and a second distribution recess extending into a second surface of the modular manifold, wherein the second surface is separate from the first surface;
      a plurality of inlet connection tubes positioned at an inlet end of the modular manifold, wherein at least one inlet connection tube is angled with respect to a surface of the modular manifold, at least one inlet connection tube fluidly couples the inlet tube to the first distribution recess, and at least one inlet connection tube fluidly couples the inlet tube to the second distribution recess;
      a plurality of outlet connection tubes positioned at an outlet end of the modular manifold, wherein at least one outlet connection tube fluidly couples the outlet tube to the first distribution recess and at least one outlet connection tube fluidly couples the outlet tube to the second distribution recess;
   a first manifold insert removably positioned within the first distribution recess and a second manifold insert removably positioned within the second distribution recess; and
   a first heat transfer plate and a second heat transfer plate each removably coupled to the modular manifold, wherein the first and second heat transfer plates each comprise an impingement surface.

2. The modular jet impingement assembly of claim 1, wherein the first surface of the modular manifold is opposite the second surface of the modular manifold.

3. The modular jet impingement assembly of claim 1, wherein the first and second manifold inserts each comprise:
   one or more inlet branch channels fluidly coupled to at least one inlet connection tube of the plurality of inlet connection tubes, each inlet branch channel including an impinging slot; and
   one or more outlet branch channels fluidly coupled to the one or more inlet branch channels and at least one outlet connection tube of the plurality of outlet connection tubes, each outlet branch channel including a collecting slot.

4. The modular jet impingement assembly of claim 3, wherein the impingement surface of the first and second heat transfer plates fluidly couples the impinging slot of the one or more inlet branch channels of the first and second manifold inserts, respectively, to the collecting slot of the one or more outlet branch channels of the first and second manifold inserts, respectively.

5. The modular jet impingement assembly of claim 1, wherein the impingement surface of the first heat transfer plate comprises an array of fins that extend toward the first manifold insert.

6. The modular jet impingement assembly of claim 5, wherein the array of fins are tilted with respect to the impingement surface and at least one fin of the array of fins comprises a cross-sectional area at a base portion of the at least one fin that is larger than a cross-sectional area at a tip portion of the at least one fin.

7. The modular jet impingement assembly of claim 1, wherein the impingement surface of the first heat transfer plate comprises an impingement block extending toward the first manifold insert, wherein the impingement block comprises a non-thermally conductive material.

8. The modular jet impingement assembly of claim 1, wherein the plurality of inlet connection tubes comprise a first inlet connection tube having a first inlet diameter and a second inlet connection tube having a second inlet diameter that is larger than the first inlet diameter.

9. The modular jet impingement assembly of claim 1, wherein the at least one inlet connection tube is angled with respect to the surface of the modular manifold between about 5° and about 25°.

10. The modular jet impingement assembly of claim 1, further comprising one or more valves fluidly coupled to the plurality of inlet connection tubes, wherein the one or more valves comprise an electro active polymer and the one or more valves are communicatively coupled to a feedback loop controller, wherein the feedback loop controller provides a signal to the electro active polymer of the one or more valves to adjust a rigidity of the electro active polymer.

11. The modular jet impingement assembly of claim 1, further comprising one or more porous media portions positioned within the inlet tube, at least one inlet connection tube, the outlet tube, or a combination thereof.

12. The modular jet impingement assembly of claim 1, wherein a first modular manifold is removably coupled to a second modular manifold positioned adjacent the first modular manifold and one or more plugs are positioned between the first modular manifold and the second modular manifold such that a fluid flow path through the first modular manifold and the second modular manifold comprises a parallel flow pattern or a series flow pattern.

13. A power electronics module comprising:
a modular jet impingement assembly comprising:
an inlet tube fluidly coupled to a fluid inlet;
an outlet tube fluidly coupled to a fluid outlet;
a modular manifold comprising:
a first distribution recess extending into a first surface of the modular manifold and a second distribution recess extending into a second surface of the modular manifold, wherein the second surface is separate from the first surface;
a plurality of inlet connection tubes positioned at an inlet end of the modular manifold, wherein at least one inlet connection tube is angled with respect to a surface of the modular manifold, at least one inlet connection tube fluidly couples the inlet tube to the first distribution recess, and at least one inlet connection tube fluidly couples the inlet tube to the second distribution recess;
a plurality of outlet connection tubes positioned at an outlet end of the modular manifold, wherein at least one outlet connection tube fluidly couples the outlet tube to the first distribution recess and at least one outlet connection tube fluidly couples the outlet tube to the second distribution recess;
a first manifold insert removably positioned within the first distribution recess and a second manifold insert removably positioned within the second distribution recess; and
a first heat transfer plate and a second heat transfer plate each removably coupled to the modular manifold, wherein the first and second heat transfer plates each comprise an impingement surface; and
an electronics device positioned in thermal contact with the first heat transfer plate.

14. The power electronics module of claim 13, wherein the first and second manifold inserts each comprise:
one or more inlet branch channels fluidly coupled to at least one inlet connection tube of the plurality of inlet connection tubes, each inlet branch channel including an impinging slot; and
one or more outlet branch channels fluidly coupled to the one or more inlet branch channels and at least one outlet connection tube of the plurality of outlet connection tubes, each outlet branch channel including a collecting slot.

15. The power electronics module of claim 14, wherein the impingement surface of the first and second heat transfer plates fluidly couples the impinging slot of the one or more inlet branch channels of the first and second manifold inserts, respectively, to the collecting slot of the one or more outlet branch channels of the first and second manifold inserts, respectively.

16. The power electronics module of claim 14, wherein the plurality of inlet connection tubes comprise a first inlet connection tube having a first inlet diameter and a second inlet connection tube having a second inlet diameter that is larger than the first inlet diameter.

17. The power electronics module of claim 13, wherein the impingement surface of the first heat transfer plate comprises an array of fins that extend toward the first manifold insert and the impingement surface of the second heat transfer plate comprises an impingement block extending toward the second manifold insert, wherein the impingement block comprises a non-thermally conductive material.

18. A power electronics module comprising:
a modular jet impingement assembly comprising:
an inlet tube fluidly coupled to a fluid inlet;
an outlet tube fluidly coupled to a fluid outlet;
a modular manifold comprising a distribution recess extending into the modular manifold, wherein the distribution recess is fluidly coupled to the inlet tube and the outlet tube;
a manifold insert removably positioned within the distribution recess;
a heat transfer plate comprising an impingement surface; and
a bracket extending along a length of the heat transfer plate to removably couple the heat transfer plate to the modular manifold; and
an electronics device positioned in thermal contact with the heat transfer plate, adjacent the bracket.

19. The power electronics module of claim 18, wherein the manifold insert comprises
one or more inlet branch channels fluidly coupled to the inlet tube, each inlet branch channel including an impinging slot; and
one or more outlet branch channels fluidly coupled to the one or more inlet branch channels and the outlet tube, each outlet branch channel including a collecting slot.

20. The power electronics module of claim 18, wherein the impingement surface of the heat transfer plate comprises an array of fins extending toward the manifold insert or comprises an impingement block extending toward the manifold insert, wherein the impingement block comprises a non-thermally conductive material.

* * * * *